United States Patent [19]

Bhagat

[11] Patent Number: 5,070,317

[45] Date of Patent: Dec. 3, 1991

[54] MINIATURE INDUCTOR FOR INTEGRATED CIRCUITS AND DEVICES

[76] Inventor: Jayant K. Bhagat, 930 Andover Way, Los Altos, Calif. 94022

[21] Appl. No.: 298,158

[22] Filed: Jan. 17, 1989

[51] Int. Cl.⁵ .................. H09F 5/00; H01L 27/00
[52] U.S. Cl. ................................ 336/200; 357/65; 357/84; 357/51
[58] Field of Search ............... 336/200; 357/51 L, 84, 357/65, 51

[56] References Cited

U.S. PATENT DOCUMENTS

| | | | |
|---|---|---|---|
| 3,403,323 | 9/1968 | Wanlass | 336/215 |
| 3,431,468 | 4/1967 | Huffman | 357/84 |
| 3,614,554 | 10/1971 | Richardson | 336/200 |
| 3,765,956 | 10/1971 | Li | 357/59 |
| 3,881,244 | 5/1975 | Kendall | 336/200 |
| 4,322,698 | 3/1982 | Takahashi et al. | |
| 4,322,700 | 3/1982 | Everhart et al. | |
| 4,322,701 | 3/1982 | Drapeau | |
| 4,383,270 | 5/1983 | Schelhorn | 357/65 |
| 4,543,553 | 9/1985 | Mandai et al. | |
| 4,649,755 | 3/1987 | Volz | 336/200 |
| 4,675,628 | 6/1987 | Rosen | 357/58 |
| 4,785,345 | 11/1988 | Rawls et al. | 357/51 |
| 4,835,598 | 5/1989 | Higuchi et al. | 357/81 |
| 4,859,633 | 8/1989 | Bayraktaroglu | 357/51 |

FOREIGN PATENT DOCUMENTS

| | | | |
|---|---|---|---|
| 3346659 | 7/1985 | Fed. Rep. of Germany | 357/51 L |
| 0110009 | 8/1980 | Japan | 336/200 |
| 0124859 | 7/1985 | Japan | 357/51 L |

OTHER PUBLICATIONS

K. Kawabe, H. Koyama, K. Shirae, "Planar Inductor", *IEEE Transactions on Magnets*, vol. Mag-29, No. 5, Sep. 1984.

Nabil Saleh, "Variable Microelectronic Inductors", *IEEE Transactions on Components, Hybrids, and Manufacturing Technology*, vol. CHMT-1, No. 1, Mar. 1978.

N. Saleh, A. H. Qureshi, "Permalloy Thin-Film Inductors", *Electronics Letters*, Dec. 31, 1970, vol. 6, No. 26.

R. F. Soohoo, "Magnetic Thin Film Inductors for Integrated Circuit Applications", *IEEE Transactions on Magnetics*, vol. Mag-15, No. 6, Nov. 1979.

*Primary Examiner*—R. Skudy
*Assistant Examiner*—Nilay H. Vyas

[57] ABSTRACT

Spaced apart conductive strips are provided in a first and third of three layers covering a semiconductor substrate. Magnetic core material is included in the second layer so as to be interposed between the conductive strips of the first and second layers. The first and second layers are joined at suitable points so that their respective conductive strips combine to form a helical electrical path which spirals about a core portion of the magnetic material in the second layer. The second layer can be patterned to define a toroidal magnetic path and/or to define a path including a magnetic gap. The armature of an electromechanical relay can be formed within the optional gap by depositing magnetic armature material to partially overlap a sacrificial support base. When the sacrificial support base is etched away, it leaves the overlying armature material free to move.

6 Claims, 20 Drawing Sheets

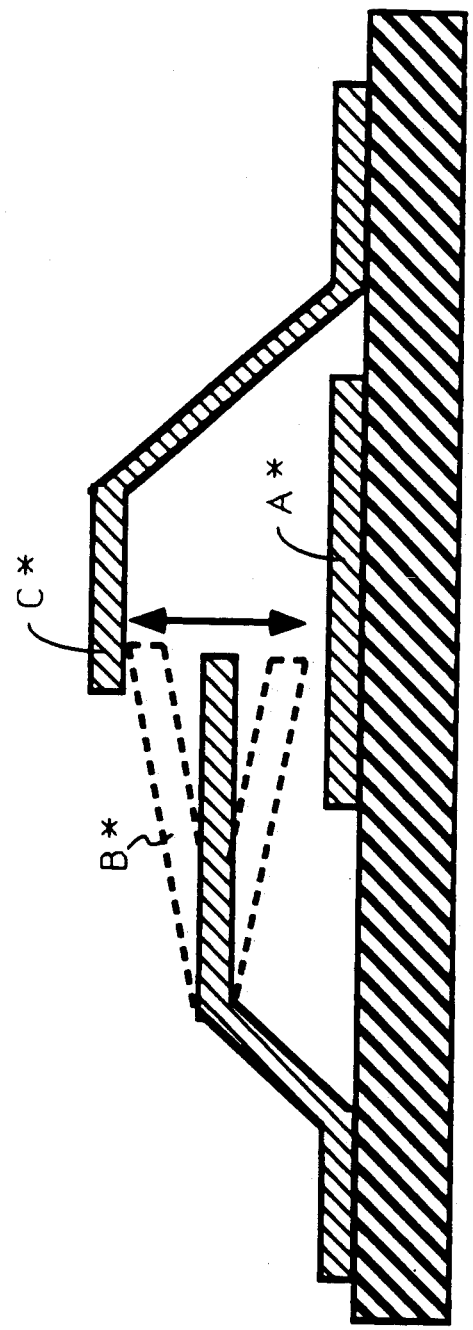

MINIATURE INDUCTOR FOR INTEGRATED CIRCUITS AND DEVICES

BACKGROUND OF THE INVENTION

1. Field of the Invention

The present invention relates generally to miniature inductors and a process of making the same.

The invention is more specifically related to forming compact circuits including semiconductor integrated circuits and miniature inductive devices.

2. Description of the Prior Art

Conventional inductors, such as those used in power handling applications and the like, are typically made of discrete magnetic cores and continuous lengths of wire wound about the cores. The integration of such discrete inductors with integrated analog or digital microcircuits has been difficult if not impossible to implement in the past because of incompatibilities between the fabrication processing requirements or operating requirements of integrated circuit chips and those of known inductors.

One incompatibility which has long existed between integrated circuit chips (IC's) and inductors is size difference. Traditional inductors tend to be much larger than IC's. Small, discrete inductors have been recently developed and commercialized by companies such as TDK of Japan, but these discrete devices have not been integrated with semiconductor chips because of other incompatibilities which still remain.

By way of example, U.S. Pat. No. 4,322,698, entitled "Laminated Electronic Parts And Process For Making The Same" and issued Mar. 30, 1982 to Takahashi et al., discloses a method of making a discrete, miniature inductor wherein a monolithic structure is produced using screen printing and ceramic sintering. An insulating sheet composed of magnetic or dielectric material is formed from a paste, and a conductive pattern is deposited thereon. A second sheet of electrically insulating material or electrically insulating magnetic material is superimposed on the first sheet and a second conductive pattern is formed thereon. The second conductive pattern is then electrically connected to the first conductive pattern. The process is repeated until a laminated part having a desired number of alternate layers is obtained. Finally, thin terminal electrodes are attached to edges of the laminated part. Individual layers of the laminated part are produced by a thick film ceramic process wherein powders of selected materials are kneaded with a suitable binder and a suitable solvent to form a paste. The paste is extruded into or stamped out as thick sheets which are about ten microns thick. The sheets are patterned with conductive material and laminated as described earlier and the resulting aggregate structure is sintered to bind the laminations together. Inductors produced by this process are smaller than previous wire wound inductors but this technique is incompatible with integrated circuit technology because there is the danger that the sintering temperatures can destroy the microcircuitry of an IC chip. Thus, the combination of this technique with semiconductor IC's is not possible. Further, since this technique uses thick film technology for patterning the sheets, the resulting inductors tend to be larger in size than inductors produced by thin film techniques. So the Takahashi method does not provide an inductive structure of ultraminiaturized size, and the idea of integrating such large inductors with ultraminiature IC's does not seem practical.

Unfortunately, the integration of known thin film techniques with IC's is also impractical. Such thin film techniques are incompatible with conventional IC technology for other reasons. By way of one example, K. Kawabe, H. Koyama and K. Shirae, describe in an article entitled "Planar Inductor," IEEE Trans. on Magnetics, Vol. Mag-29, No. 5, September 1986, several types of planar inductors which can be produced by thin film technology. The conductive turns making up an inductor of this technique are all coplanar, i.e., they each lie in one and the same plane, and the plane of the turns is parallel to the substrate. Magnetic flux lines induced by such planar turns tend to flow in a direction perpendicular to the plane of the turns and the plane of the substrate. This orientation can interfere with adjacent semiconductor circuitry if such semiconductor circuitry is provided and brought into close proximity with (i.e. less than 1000 microns away from) the planar inductor. This makes planar inductors incompatible with integrated circuit chips having circuitry disposed at a planar surface thereof.

The process of making planar inductors begins with direct current (D.C.) sputter deposition of permalloy magnetic material on a glass substrate. The magnetic material is capped by an insulating layer of silicon monoxide, the latter being deposited by vacuum evaporation. A thin chromium layer is deposited on the capped magnetic material and a layer of conductive copper is then deposited on the thin chromium layer. A planar coil is patterned in the copper and chromium layers by standard photolithographic and etching steps. After forming the planar coil, a second insulating film of silicon monoxide and a top layer of permalloy material are deposited by vacuum techniques.

Another planar type of thin film inductor is described by N. Saleh and A. H. Qureshi in an article entitled "Permalloy Thin Film Inductors," Electronics Letters, pp. 850-852, Dec. 1970. A planar spiral conductor, composed of copper, is surrounded by a pair of spaced-apart permalloy thin films. The permalloy thin films (1000-3000 Å hick) are formed by vacuum deposition. The conductive copper coil is interposed between the Permalloy thin films by depositing an SiO on bottom permalloy layer then using vacuum evaporation of copper and electroplating of additional copper to obtain 25 $\mu$m thick copper conductors. The spacing between turns is $10^{-3}$ inch and the conducting path is $5 \times 10^{-3}$ inch wide. The silicon monoxide (SiO) layer is about 10,000 Å thick. The whole pattern lies on a glass substrate.

Yet another method of making small inductors is proposed by R. F. Sooho, in an article entitled "Magnetic Thin Film Inductors For Integrated Circuit Applications", IEEE Trans. on Magnetics, Vol. Mag-15, No. 6, November 1979. The Sooho article states that it is difficult to fabricate small air-core inductors of sufficiently high inductance and Q (the ratio of reactive impedance and conductor resistance) due to the large number of turns that must be realized in an extremely small space. In order to minimize the number of turns for realizing a given inductance, the Sooho article suggests to fabricate thin film inductors with high permeability cores. The inductors are manufactured by forming a permalloy film on a glass or Si substrate. $SiO_2$ is deposited onto the film using spin-on oxide deposition, after which five turns of wire are deposited so as to wrap them around the combination of the SiO$_2$, permalloy film and substrate in the manner shown in FIG. 1.

It is observed in the Sooho paper that the achieved inductance and susceptibility are not as high as expected. This is attributed to the fact that the magnetic path is not formed entirely of a permalloy material. The core of the coil has a permeability determined in part by the contributions of the nonpermalloy substrate and the air gap; and is thus, less than that of the permalloy material taken alone.

As can be seen from the above, prior proposals for forming miniature inductors have provided techniques which are incompatible with the formation and/or operation of integrated circuit chips. Problems arise because processing temperatures may be too high, inductor permeability may be too low, and as will now be explained, because it is unacceptable to have a situation where time variant flux lines may pass through sensitive portions of an integrated circuit chip.

When time variant flux lines of substantial strength pass through conductive portions of an integrated circuit, it is possible for such flux lines to induce undesired voltages or currents within the integrated circuit. As a consequence, IC's are usually spaced far apart from magnetic components. The aforementioned planar inductors (i.e., of Saleh et al.) are not integrable with IC chips because their planar orientation tends to generate flux lines that pass orthogonally into the planar circuitry of an IC chip. The aforementioned Si-substrate, thin film inductors of Sooho (FIG. 1) are not integrable with IC chips because flux lines are induced to flow directly through the cross-sectional area of the Si- substrate portion of the coil core.

The above described problems have biased practitioners in the integrated circuits arts away from the use of magnetic components (i.e., inductors, transformers and relays) and towards pseudo-equivalent components which rely on nonmagnetic properties (i.e., capacitors, optical isolation and so-called "solid state relays"). But such pseudo-equivalent components do not always perform as well as their magnetic counterpart. By way of example, it is difficult to produce RC based filters which have the same characteristics as LC based filters. By way of further example, optical circuit isolation does not provide the same coupling efficiency as transformer based isolation. By way of even further example, solid state relays rarely operate in a manner which allows them to be substituted for electromechanical relays (electromagnetic relays). Electromechanical switches or relays are routinely used in a variety of applications such as high-frequency telecommunication network switching, automotive control and large equipment control (i.e., starting large horsepower electric motors). They offer advantages which are not easily replicated by nonmagnetic, solid-state substitutes.

It has been common practice to provide magnetic components, such as transformers and electromechanical relays, as discrete components on printed circuit boards, separate from IC chips. This practice evolves from the incompatibilities between known inductor fabrication techniques and conventional chip fabrication processes. Such discrete types of circuitry tend to have higher cost and lower reliability than integrated circuitry. It would be desirable and advantageous to have one or more methods by which magnetic components such as inductors, transformers and electromechanical relays can be integrally formed with semiconductive microcircuitry.

SUMMARY OF THE INVENTION

It is an object of the invention to provide magnetic components such as single coil-inductors, multiple-coil transformers or composite RLC filters which are easily adapted to mass production, are very small in size and are capable of either being mounted in discrete fashion on a printed circuit board or being integrally formed directly on an integrated circuit chip.

It is another object of the invention to provide a miniaturized electronic part including at least one inductor having several turns of insulated conductor helically (spirally) disposed around a permalloy core and having dielectric insulation separating each turn of the conductor from the core. In certain embodiments, the inductive part is integrally formed with a capacitor, a resistor, and/or an integrated circuit chip (semiconductive substrate). In other embodiments it is further integrated with portions of an electromagnetic switch relay.

A further object of the invention is to provide methods for making the above-mentioned electronic parts.

Yet another objective of the present invention is to provide a miniaturized electromechanical (electromagnetic) switch or relay.

An electronic part according to the present invention is preferably formed on a planar semiconductor substrate such as a monocrystalline silicon wafer or on the surface of a passivating layer provided on an integrated circuit chip. If the initial substrate material is electrically conductive, an insulating layer is preferably first deposited or grown on the surface of the substrate. A first layer of permalloy or other magnetic material is deposited on the substrate and enclosed by one or more electrically insulating layers. A first conductor layer formed of spaced apart conductor strips is superimposed on top of the insulated, first magnetic layer. On top of this first conductor layer there is deposited a second layer of permalloy or other magnetic material. The second layer of magnetic material is spaced apart from the first conductor layer by an insulating layer. The second magnetic layer is covered with electrical insulation and dimensioned or patterned to leave exposed at least two spaced apart contact points on each of the conductive strips of the first conductor layer. On top of this second magnetic layer there is formed a second conductor layer comprised of spaced apart conductor strips. The conductive strips of the first and second conductor layers are joined together at the contact points of the first conductor layer in such a way that they form a continuous spiral shaped (helical) conducting path for conducting electrical current around the magnetic material of the second magnetic layer. The permalloy or other magnetic material of the second magnetic layer thus forms the core of an electromagnet and the spiral shaped conducting path forms the coil. The first magnetic layer may serve as a magnetic shield for blocking flux lines from entering the semiconductive substrate and/or it may be part of a magnetic flux circuit including the second magnetic layer.

The magnetic core of the thusly formed electromagnet may form part of a closed magnetic path (i.e., a toroidal core) or one including a magnetic gap (i.e., air gap). In the latter case, an electric switch or relay of miniature size may be provided by positioning a movable portion of a mechanical arm (armature) in the gap and resiliently or fixedly coupling another portion of the mechanical arm to the semiconductive substrate. A fixed electrical contact may be provided at one end of the magnetic gap and a movable electrical contact may be provided at the movable portion of the mechanical arm such that upon energizing the magnetic circuit, the movable contact moves to either make or break continuity in an electrical path passing through the fixed and movable contacts.

If desired, two or more moving arms may be provided inside one or more gaps of a magnetic circuit formed in accordance with the invention. A wide variety of complex switching networks can then be formed on one or more integrated circuit chips. The moving arms are preferably insulated from the conductors of the coil and the magnetic material of the core so that good isolation can be provided between control circuits and load circuits. Upon energizing the magnetic circuit, the movable arms may move either vertically or laterally relative to the major surface of the semiconductive substrate so as to close or open plural electric circuits connected to the movable arms. The numerous variations that are possible will become apparent once the spirit and principles of the invention are understood.

BRIEF DESCRIPTION OF THE DRAWINGS

FIG. 9 is a side view of another vertical swing relay.

FIGS. 10A, 10B through 17A, 17B describe a method of making an inductor according to the invention.

DETAILED DESCRIPTION OF THE INVENTION

Figure 1:
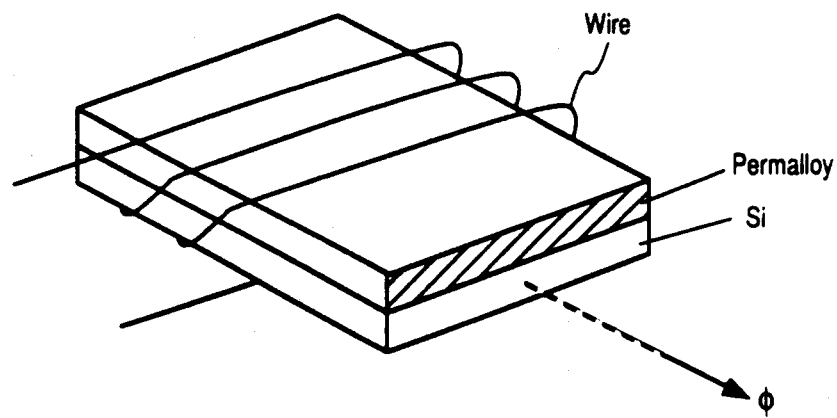
FIG. 1 is perspective view of a previously proposed inductor.

The following is a detailed description of the best presently contemplated modes for carrying out the invention. It is to be understood that these modes are merely illustrative of the spirit of the invention and that they are not to be viewed as limiting the scope of the accompanying claims.

In the practice of the present invention, the coil or coils of an inductor are preferably formed using microelectronics manufacturing technology (integrated circuit fabrication materials) and electroplating techniques so that the fabrication of an electromagnetic component becomes compatible with and integrable with the fabrication of semiconductor-based integrated circuits. A substrate composed of monocrystalline silicon, silicon dioxide and/or other materials compatible with the production of semiconductor based, microelectronic integrated circuits, is provided to support the coil or coils of the inductor. The disclosed methods permit coils to be integrally bonded to an integrated circuit chip or wafer.

The provided substrate is preferably first insulated to prevent undesired electrical shorting. If the initial substrate is conductive (i.e. doped silicon) a layer of insulator material (passivation layer) is formed thereon to protect microelectronic circuitry within the substrate. The insulator material used on the substrate is preferably an organic compound such as polyimide (available from Du Pont Corp.) or an inorganic compound such as silicon dioxide or silicon nitride. If desired, it is possible to use a combination of organic and inorganic compounds so as to increase the breakdown voltage or dielectric strength of the initial insulation layer. Preferably polyimide is spin-coated either directly on the conductive surface of a integrated circuit wafer or on the oxide or passivation layer protecting an integrated circuit wafer or die. The polyimide may be patterned as desired by dry plasma etching or wet chemical etching using suitable masking materials such as aluminum or silicon nitride, etc.

A plurality of spaced apart conductor strips are used in the conductor layers of this invention and these conductor strips are preferably each formed as a multi-layer structure of thick (5 to 30 microns) copper (Cu) electroplated on top of a thin, vacuum evaporated (sputtered) base metal (i.e., base copper having a thickness of approximately $\sim 1000$ Å). The base metal adheres to the polyimide layer or to a suitable bonding layer (interfacial material) that is formed directly on the substrate or on a substrate insulating material. The bonding layer may be composed of bonding materials such as titanium (Ti), titanium-tungsten (Ti/W), chromium, etc. The role of the bonding layer (500–2000 Å) is to form a strong mechanical (and/or chemical) bond between the copper conductors and the underlying substrate. Without the bonding layer, the conductor pattern might peel off the substrate under certain conditions.

In some cases where the resistance of the coil conductors is not critical (e.g., low Q inductors or control-current portions of a high-power control circuit), where only low levels of current (i.e., less than a few milliamperes) are to be carried, the electroplating of thick copper onto the initially deposited base metal (base copper) may not be needed and the thickness of the vacuum (sputter) deposited base metal can be built up to a desired thickness (1–3 $\mu$m) by repeated vacuum deposition or sputtering so that resistance is reduced to an acceptable level. Also, where the conductivity of the conductor strips is not critical, a low conductivity metal such as aluminum can be substituted for the more conductive copper.

The magnetic material used for the core of the inductor is preferably a high resistivity permalloy such as NiFe, NiZn, or $Fe_3O_4$ doped with Ni, Fe, and/or Mg. By way of example, resistivity ranges of from approximately 40 $\mu\Omega$-cm (for 50% Ni-Fe) to $10^7$ $\mu\Omega$-cm (for Ni-Zn ferrite) are acceptable. Choice is dependent upon the deposition requirements of the magnetic material and upon further processing requirements such as post deposition annealing and patterning. Ni-Fe or other permalloy materials that can be easily formed as a sputtering target are preferred for the methods described below. Although the embodiments of the invention are described with particular materials, it is to be understood that other materials having analogous properties may work as well.

Figure 2:
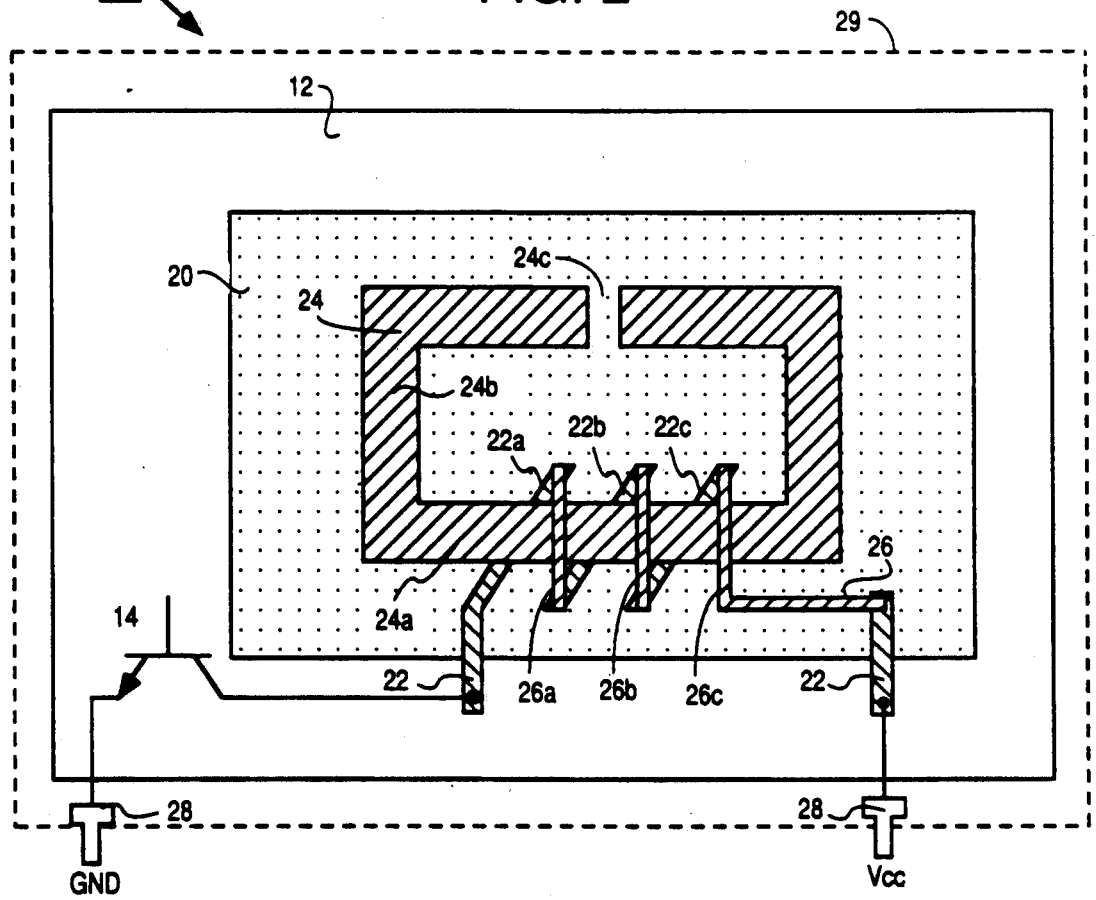
FIG. 2 is a simplified top view of an integrated circuit in accordance with the invention.

The basic structure of an electromagnetic component according to the invention may be appreciated by referring to the simplified top plan view of FIG. 2. An electromagnetic device 10 in accordance with the invention comprises: a semiconductor substrate 12 having one or more active electronic devices 14 (i.e. transistors, diodes, digital control circuits, etc.) integrally incorporated in the substrate 12; a magnetic shield layer 20 disposed over the substrate 12; a first conductor layer 22 formed of spaced apart, parallel conductor strips 22a–22c, the first conductor layer 22 being insulatively disposed on the shield layer 20; a magnetic core layer 24 composed of a suitable thin film magnetic material such as permalloy, the thin film magnetic core layer 24 being insulatively disposed over the first conductor layer 22 and being patterned to define an electromagnetic core portion 24a and a magnetic flux path 24b (the latter portion having an optional magnetic gap 24c defined therein); and a second conductor layer 26, formed of spaced apart, parallel conductors strips 26a–26c which are oriented at an angle relative to the conductor strips 22a–22c of the first conductor layer 22, the second conductor layer 26 being insulatively disposed over the magnetic core layer 24.

The individual conductor strips 22a–22c and 26a–26c of the first and second conductor layers, 22 and 26, are overlapped and joined at suitable points beyond the periphery of the core portion 24a, as shown, to define a helical electrical conduction path which spirals in nonplanar fashion about the core portion 24a. Terminal ends of the helical path are connected to the circuitry 14 of the semiconductor substrate 12 and/or to terminal pins 28 of an encapsulating package 29 (i.e., DIP) enclosing the substrate 12, as desired.

Fringe flux lines from the optional gap portion 24c of the illustrated magnetic path 24b are blocked from crossing into the underlying substrate material 12 by the magnetic shield layer 20 which is interposed between the gap 24c and the substrate 12. If desired, one or more holes (not shown) could be defined through the shielding layer 20 to controllably admit flux lines from the gap 24c into preselected portions of the underlying substrate 12. Hall effect or other flux measuring components could be positioned in the substrate, below the holes, to detect flux density. For the sake of simplicity, various dielectric layers that isolate portions of the coil conductors from one another and from the core material have not yet been shown or described.

Figure 3:
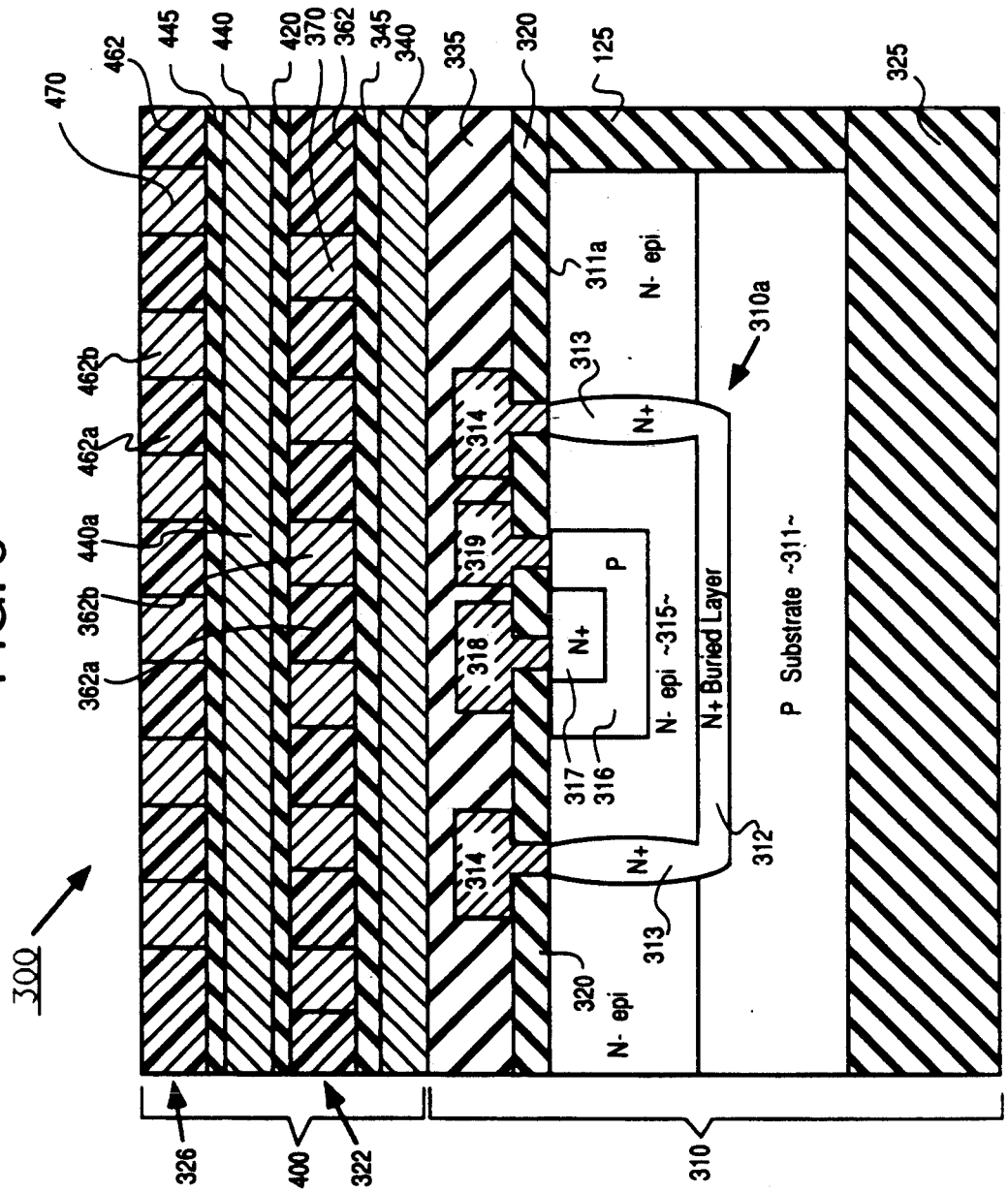
FIG. 3 is the cross-sectional view of an inductor that is integrally formed on a microelectronic circuit in accordance with the invention.

FIG. 3 illustrates the cross section of a completed embodiment 300 of the invention which includes a magnetic structure formed on the passivation layer of an integrated circuit (IC) chip in accordance with the invention. FIGS. 10A, 10B, 11A, 11B, . . . , 17A and 17B illustrate the fabrication of such an inductor at different stages of manufacture.

The embodiment 300 of FIG. 3 comprises an IC microcircuit 310 integrally incorporated in a semiconductive substrate 311 (i.e., a P doped monocrystalline silicon). The microcircuit 310 includes an NPN bipolar transistor 310a having an N+ buried collector layer 312 diffused at a deep portion of the substrate 311; and an annular N+ deeply diffused collector 313 extending from the top surface 311a of the substrate deep into the substrate to couple the buried collector layer 312 to a metal collector contact 314 at the top surface 311a of the substrate 311. The transistor 310a of the embodiment 300 further comprises an N− (lightly doped) epitaxial region 315 provided above the buried collector layer 312. A P type base well 316 is diffused into the epitaxial region 315. An N+ emitter well 317 is diffused into the P type base well 316. Emitter and base contacts, 318 and 319, are respectively provided in a substrate-contacting metal layer of the microcircuit 310. A $SiO_2$ oxide layer 320 covers the top surface 311a of the substrate 311. A glassy $SiO_2$ passivation layer 335 is deposited onto the microcircuit chip 310 to cover its microelectronic circuitry (i.e., the NPN vertical transistor 310a just described) and an electromagnet 400 is integrally formed on the passivation layer 335 of the chip as will now be described.

The electromagnet 400 comprises a first permalloy layer 340 (shield layer) bonded on to the passivation layer 335, a first sputtered-on insulating layer 345 ($SiO_2$) deposited on the first permalloy layer 340, and a first polyimide insulation layer 362 deposited on the first sputtered-on insulating layer 345. Grooves are patterned into the first polyimide layer 362, as shown, to define conductor vias 362b. The conductor vias 362b are filled with conductor strips 370 belonging to a first conductor layer 322 of the embodiment 300. A second $SiO_2$ insulation layer 420 is sputter deposited onto the first conductor layer 322 to partially cover the conductor strips 370. Openings (not shown) are provided through the insulation layer 420 for forming a to-be-described helical conduction path which includes the conductor strips 370 of the first conductor layer 322.

A second permalloy layer 440 is formed on the second $SiO_2$ insulation layer 420 and this second permalloy layer 440 is patterned to include a core portion 440a having a geometry which permits formation of the helical conduction path (coil) that is to spiral thereabout. A second polyimide layer 462 is provided on the second permalloy layer 440 and patterned to support a second conductor layer 326 formed of conductor strips 470. The conductor strips 470 are joined (not shown) with the conductor strips 370 of the lower conductor layer 322 to form one or more helical coils which surround the core portion 440a and perhaps other portions (not shown, see FIG. 5) of the second permalloy layer 440. The coils are coupled to the microelectronic circuit 310 of the substrate 311, as desired, to define a predesigned electromagnetic circuit.

The possibilities for applications of this structure are endless. By way of example, the predesigned electromagnetic circuit could be an LC filter (i.e., FIGS. 22A–22C), a magnetic transducer in combination with an amplifier, a solid state relay having transformer isolation (i.e., FIGS. 4, 23 and 24) provided between low-power control and high-power responsive sections of the solid state relay, or an electromechanical relay circuit (i.e., FIGS. 6–9).

The invention can be understood with more specificity by describing how an embodiment thereof is preferably fabricated. The "A" suffixed drawings, FIGS. 10A–17A, are paired with corresponding "B" suffixed FIGS. 10B–17B, to respectively show a top plan view ("A" figures) and a cross-sectional view ("B" figures) at each step of manufacture.

Figure 10A:
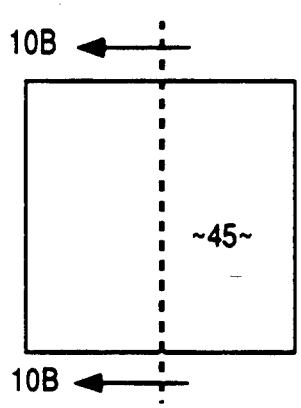
Figure 10B:
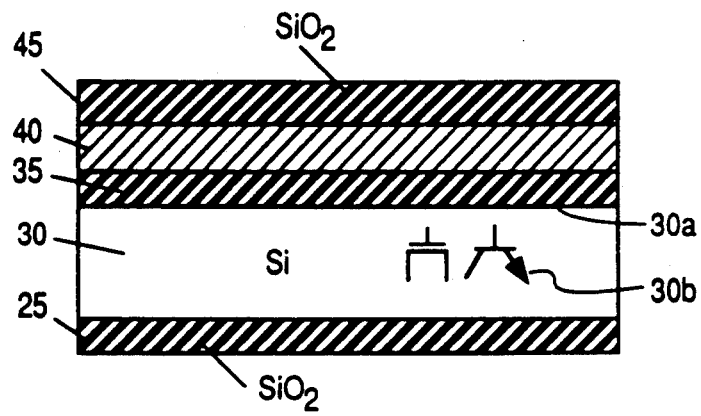

Referring to FIGS. 10A and 10B, the top surface 30a of a silicon substrate 30 (which can optionally include integrated circuitry 30b diffused therein) is covered with a first layer of thermally grown $SiO_2$ 35 (approximately 0.1 to 1.0 micron thick). Another insulating layer 25 of $SiO_2$ may be optionally provided on the bottom surface of the substrate. A first permalloy layer 40 (approximately 0.1 to 0.5 micron thick) is deposited onto the first $SiO_2$ layer 35 by sputtering. The first permalloy layer 40 may serve as a magnetic shield and/or as part of a to-be-formed magnetic circuit. In some cases, such as that of a closed magnetic loop formed above the substrate, (i.e., the toroidal transformer shown in FIG. 4), the shielding function of the first permalloy layer 40 is not needed and the shield layer 40 may be dispensed with. A thin second insulating layer 45, preferably composed of 0.1 to 0.5 micron thick $SiO_2$, is sputtered on to the first permalloy layer 40 if the latter shield layer 40 is present.

Figure 11A:
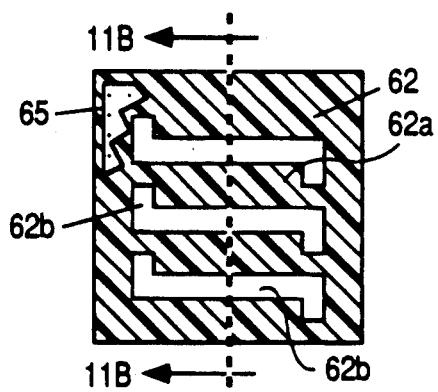
Figure 11B:
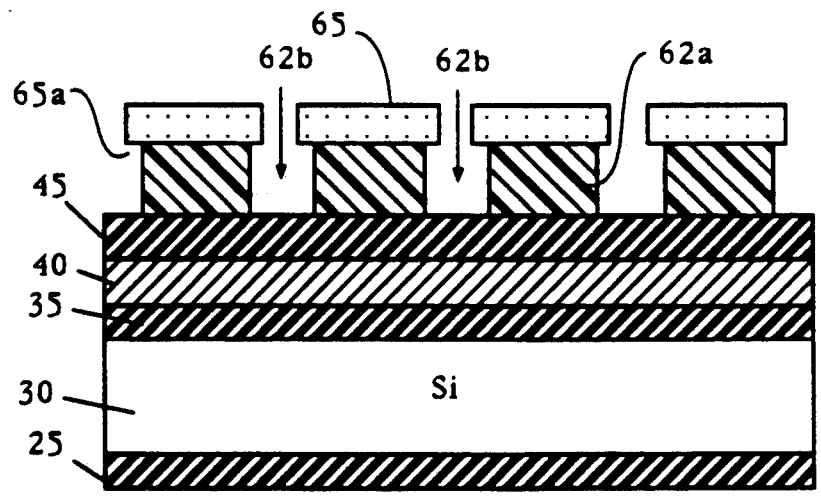

Referring to FIGS. 11A and 11B, a thick first layer (approximately 1 to 10 microns thick) of polyimide 62 is deposited on to the insulative overcoat 45 of the shield layer 40 (i.e., by means of spin coating or other suitable techniques) and patterned to include elongated, space apart strips 62a (as shown in FIG. 11A), preferably using dry etching oxygen ions or with oxygen plasma. It is possible to also pattern the polyimide strips 62a with known wet chemical etching techniques if desired. Conductor supporting vias 62b are defined by spaces left between the etch-defined polyimide strips 62a.

A masking material 65 (such as HPR 204 TM resist available from Hunt Chemical Co. of New Jersey) is used for patterning the polyimide strips 62a. This masking material 65 is retained after the polyimide patterning step so that it remains still attached to the tops of the polyimide strips 62a as shown in FIG. 11B. Due to intentional side etching of the polyimide 62, overhang portions 65a of the masking material 65 are created and these overhang portions extend laterally beyond the side walls of the vias 62b.

Figure 12A:
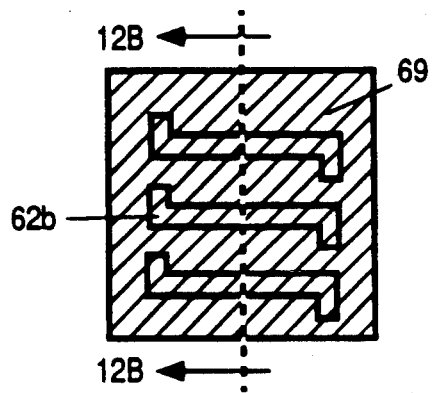
Figure 12B:
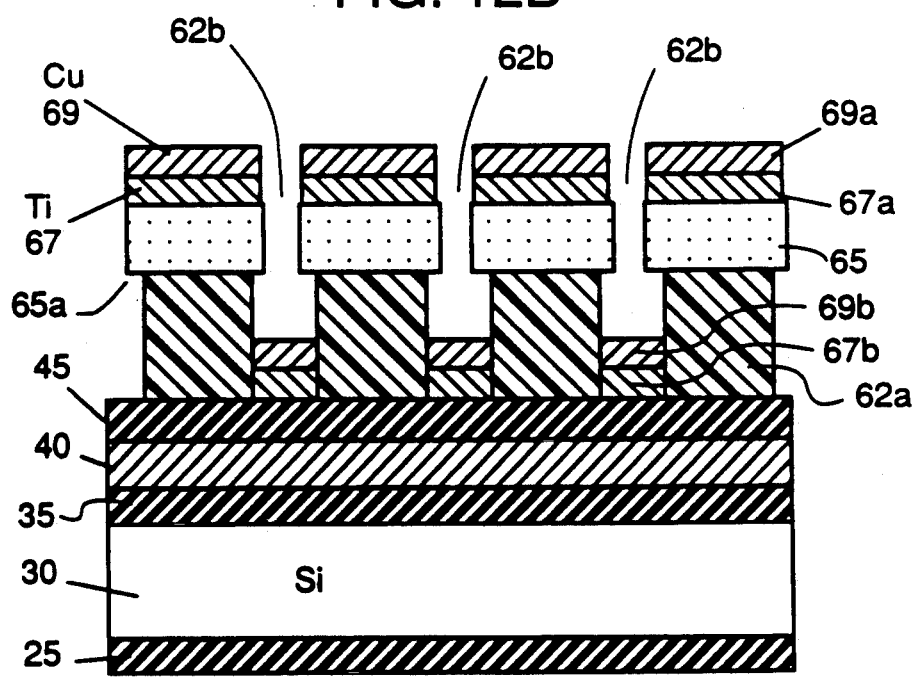

Referring to FIG. 12B, a thin bonding (interfacial) layer 67 composed of a suitable bonding material such as titanium (Ti, preferably having a thickness of about 1000 Å) is deposited on to the second $SiO_2$ insulating layer 45 as shown. The overhang portions 65a of the retained masking material 65 help to create discontinuities in the deposited thin film (Ti) bonding layer 67. This thin film 67 otherwise generally deposits uniformly on top of the retained masking material 65, at the tops of the polyimide strips 62a, and adheres to the dielectric material 45 which is exposed at the bottoms of the vias 62b. The Ti bonding layer 67 is preferably deposited by sputter deposition in an argon ambient with pressure in the range of 3 to $10 \times 10^{-4}$ Torr. The discontinuities in the interfacial layer 67 are self aligned with the retained masking material 65 so as to create separate interfacial portions 67a and 67b.

A thin base metal layer 69, preferably composed of copper (Cu), is sputter deposited onto the Ti layer 67 as shown in FIGS. 12A and 12B. The sputter deposition of the Ti layer 67 and thin copper layer (copper base) 69 may be carried out in the same sputtering machine without breaking vacuum so that a good strongly adhering bond is created between the thin copper layer 69 and the Ti interfacial layer 67. Again, the overhang portions 65a of the retained masking material 65 generate self-aligned discontinuities in the deposited thin copper layer thereby partioning the latter into separated portions 69a and 69b. It should be pointed out that chromium and/or its oxides may also be used to form good interfacial layers in place of, or in combination with, the interfacial Ti.

Figure 13A:
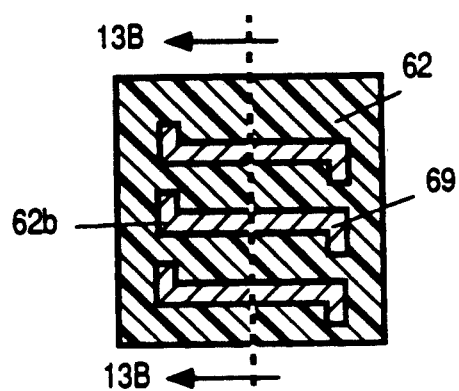
Figure 13B:
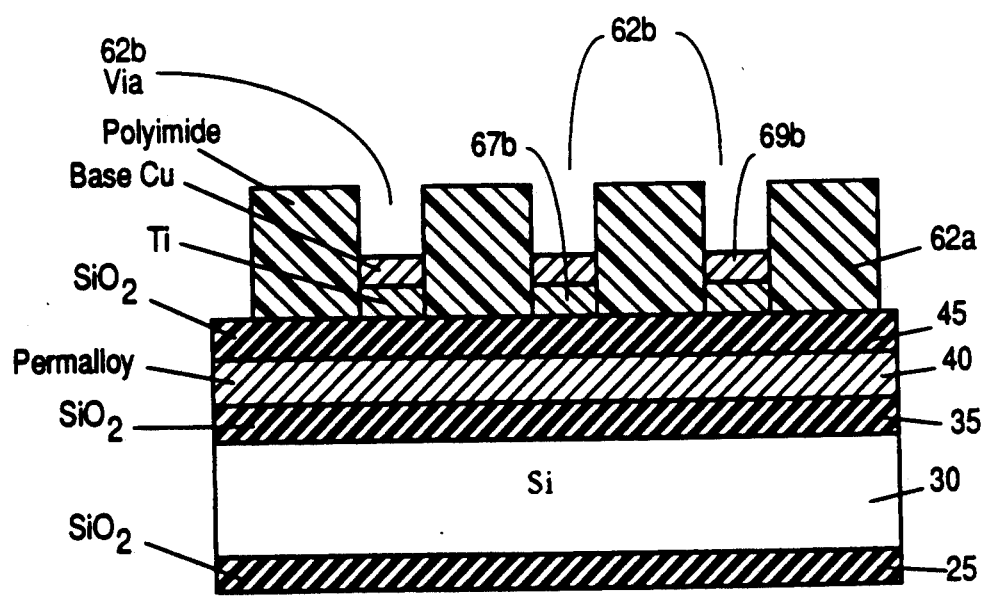

Referring to FIGS. 13A and 13B, the masking material 65 is next dissolved or etched away with a suitable solvent. There are several selections possible for the solvent depending on the material of masking layer 65. To illustrate, 65 could be a photoresist, e.g., HPR 204 TM which is available from Hunt Chemical Co. of New Jersey. In such a case it is easily removed by a commercially available solvent known as Power Strip TM which is available from PPM Technology, Inc. of Easton, Pennsylvania.

As explained above, the metal films 67 and 69 are not continuous. Accordingly, the removal of the masking material 65 automatically removes the higher deposited portions 67a and 69a while it leaves behind a pattern of the lower deposited conductors 69b and 67b in the vias 62b of the polyimide layer 62. Care should be taken in the choice of the solvent at this point so that the solvent does not include a strong acid or base which could attack the Cu base metal film 69 excessively. Strongly alkaline solvents containing, for example, NaOH or KOH should be suitably diluted and applied at low temperatures (i.e., room temperature) to minimize attack on the Cu base film 69.

Figure 14A:
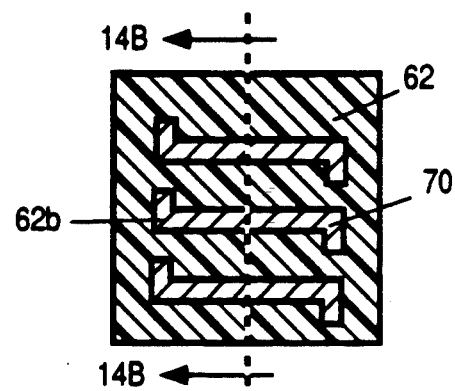
Figure 14B:
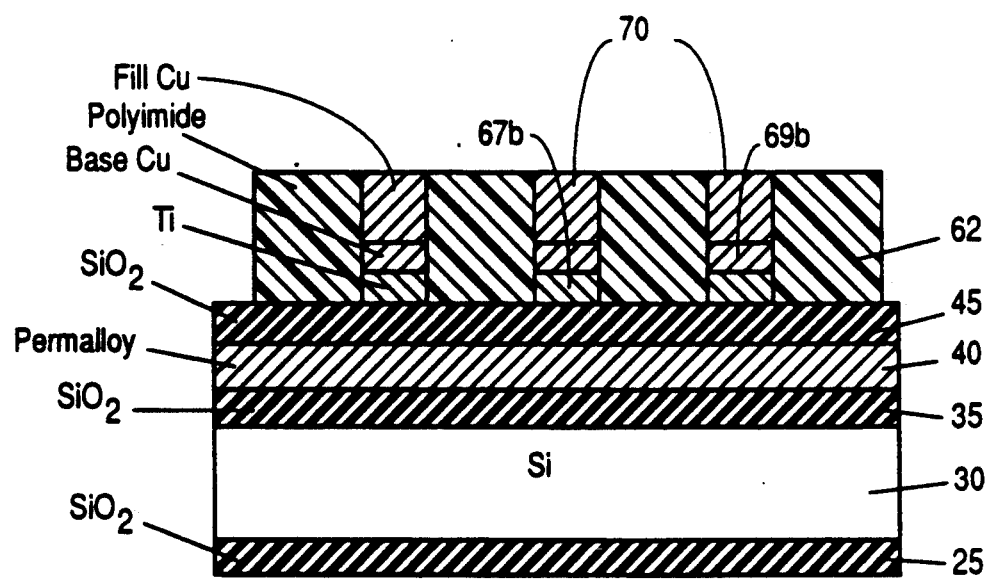

Referring to FIGS. 14A and 14B, thick copper conductor strips 70 are now electroplated onto the thin copper (base metal) layer strips 69b. This electroplating is self patterning because the thin Cu strips 69b are available only in the vias 62b of polyimide layer 62.

Figure 15A:
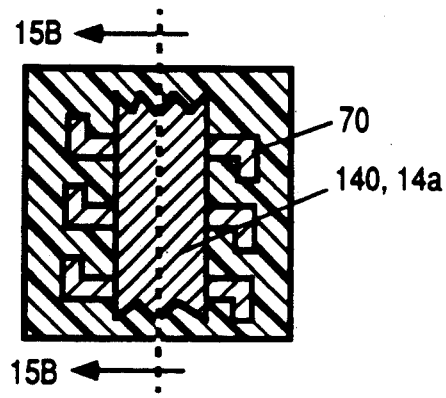
Figure 15B:
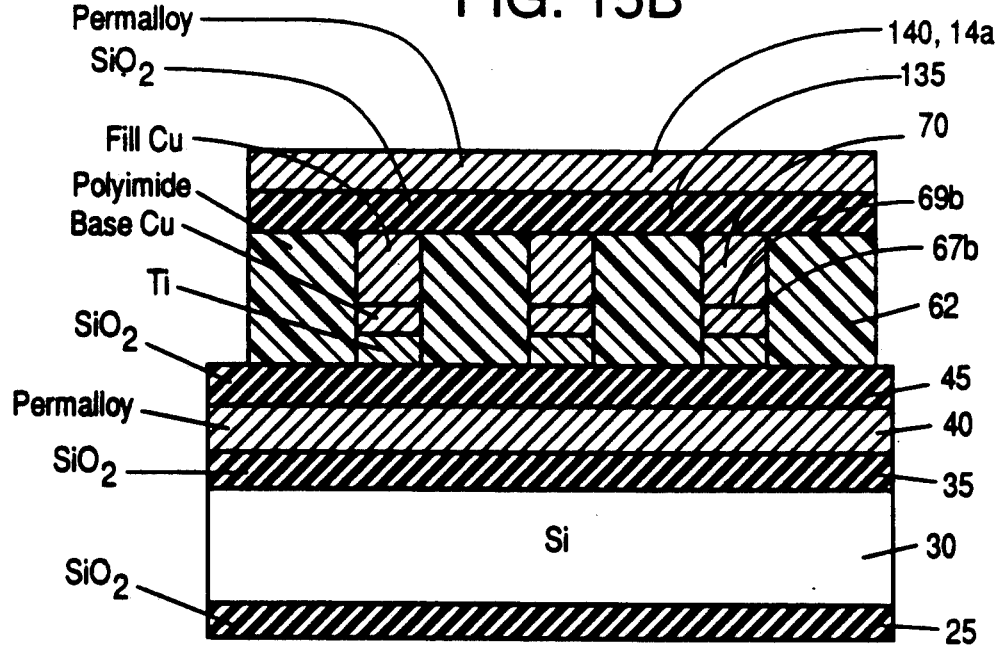

Referring to FIGS. 15A and 15B, third thin insulating layer (preferably having a thickness less than or equal to about 1000 Å), composed of $SiO_2$, 135 is sputter deposited on top of the structure in order to insure that the spaced apart, thick Cu lines 70 are not accidentally shorted. On top of the third thin insulating layer 135, a second layer of permalloy 140 is sputter deposited and patterned to define at least a core portion 140a of the to-be-formed inductor (using either an Ar or an $Ar/O_2$ atmosphere depending upon high permeability and/or high resistivity requirements of the second permalloy layer 140 which will form the core of the inductor). The thickness of the inductor core 140a is a controllable parameter that may be used to determine the value of inductance for a given core geometry This thickness parameter can be easily controlled when sputtering on the second permalloy layer 140. As known in the art, the value of the permeability can be affected by varying the temperature of the substrate during sputtering and also by carrying out sputtering in a magnetic field.

Figure 16A:
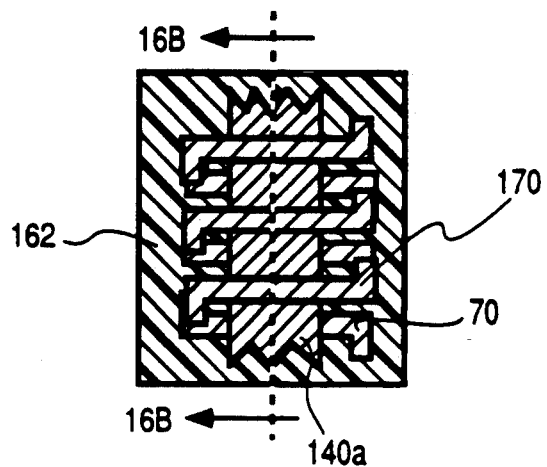
Figure 16B:
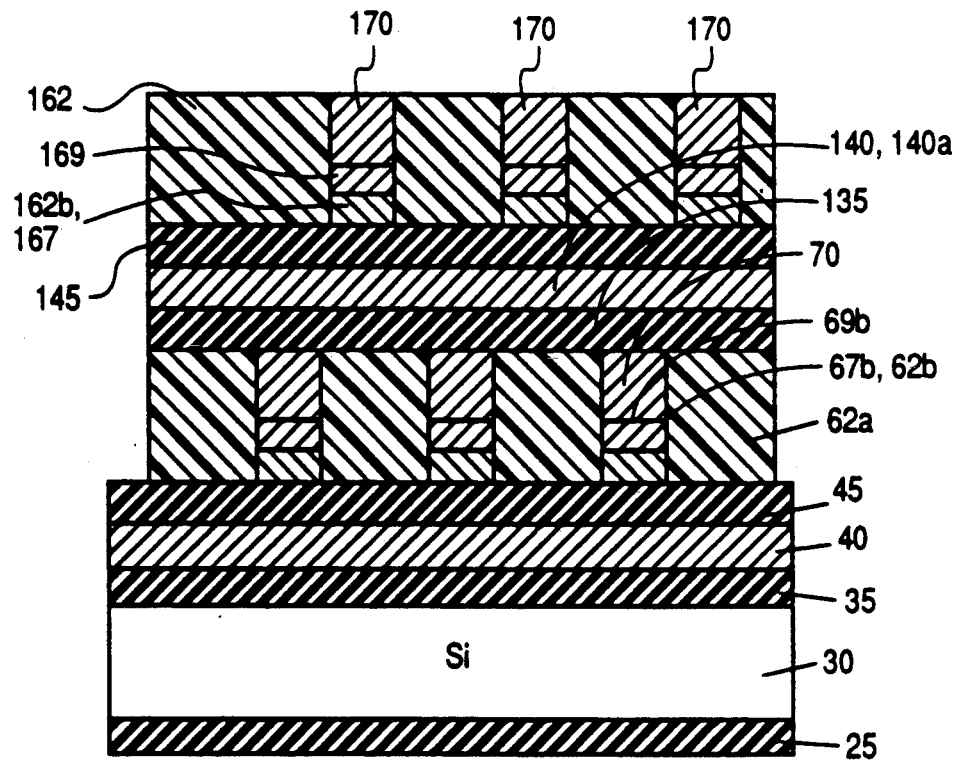
Figure 16C:
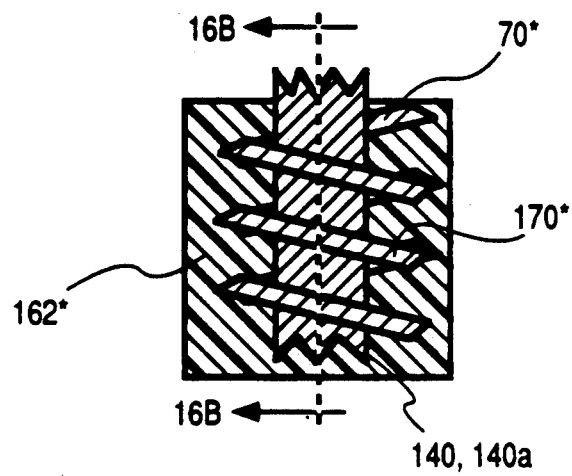

Referring to FIGS. 16A, 16B, another layer of polyimide 162 is deposited and patterned as strips 162a over the previously formed polyimide strips 62a as discussed before It is advisable to predeposit a thin layer of $SiO_2$ 145 between the second polyimide layer 162 and the second permalloy layer 140 to insure that the conductor pattern to be deposited in the vias 162b (defined between strips 162a of the second polyimide layer 162) will not be shorted to each other and/or to the magnetic core 140a. The pattern of the polyimide vias 162b formed in the upper polyimide layer 162 is such that the conductor strips of the first and second conductor layers, 70 and 170, join to form a conductive coil (helical conduction path) as shown in the top view of FIG. 16A (or in the alternative top view of FIG. 16C), which spirals about the core portion 140a of the permalloy layer 140. Also, shown in FIG. 16B are top metal patterns of interfacial Ti 167, thin base Cu 169 and electroplated thick Cu 170. These are preferably formed in the same way as described earlier.

Figure 17A:
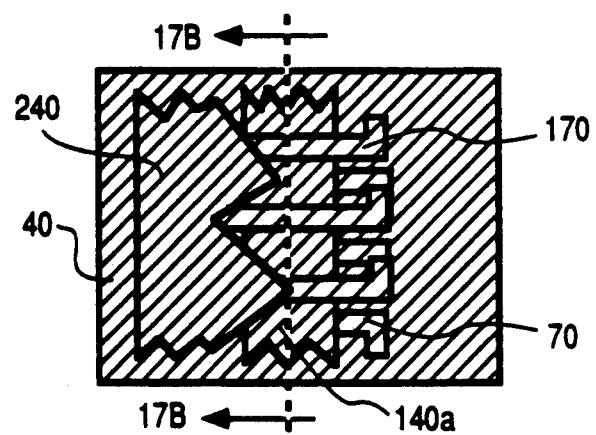
Figure 17B:
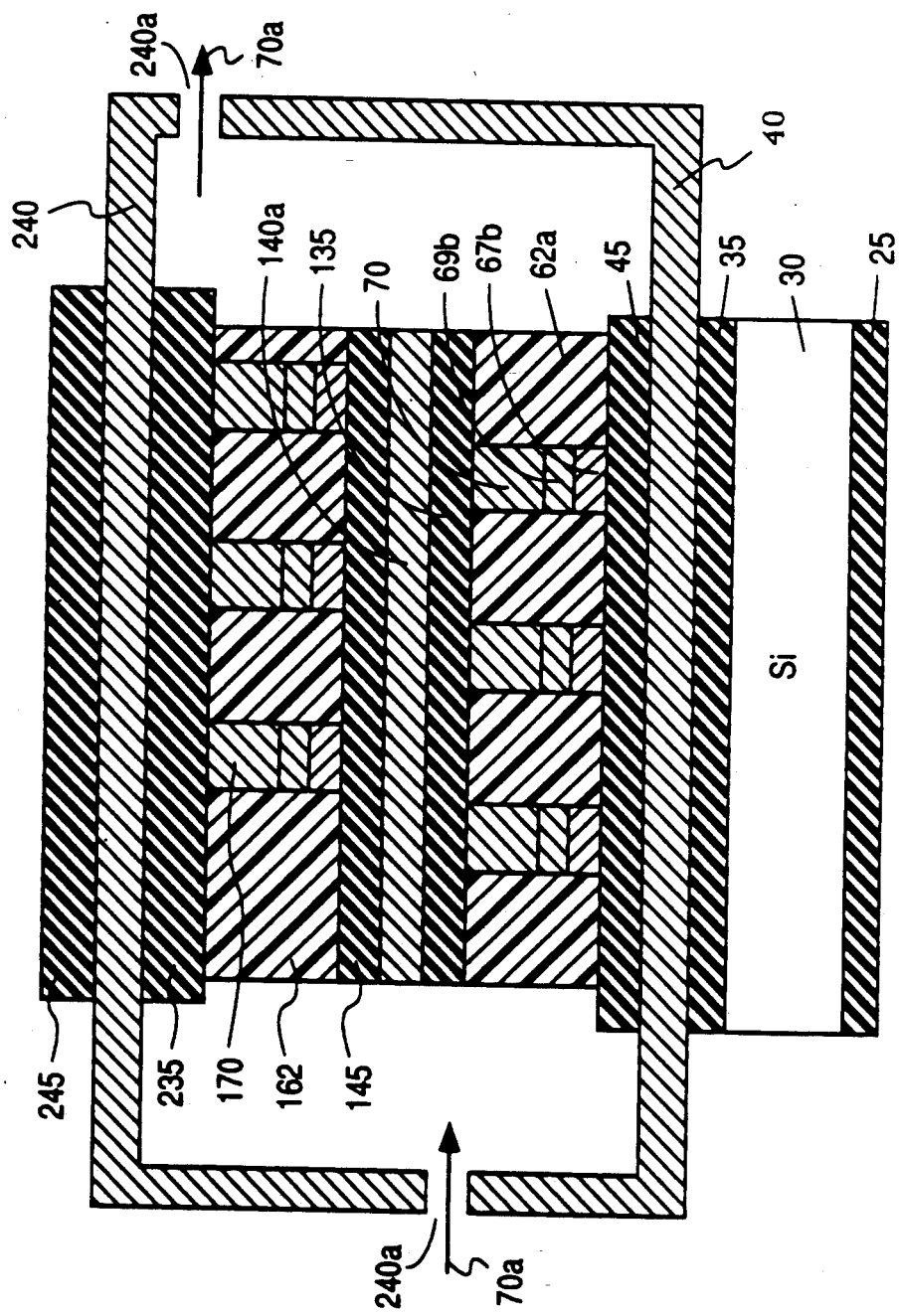

Lastly, referring to FIGS. 17A and 17B, a third layer of permalloy material 240 can be deposited and patterned as symbolically shown in FIGS. 17A and 17B to magnetically enclose the inductor almost completely (layer 240 joins with the first permalloy shield layer 40 to encapsulate the core layer 140). Of course, openings 240a and 240b are provided through the surrounding shield layers 240 and 40 to pass current input and current output lines 70a and 170a of the coil. This closed magnetic structure is but one of many possible variations. It should be apparent that the second permalloy layer 140 could be joined to either or both of the first and third permalloy layers 40 and 240. It should also be apparent that the above method could be repeated to build additional electromagnets above the core 140a of FIG. 17B.

Figure 4:
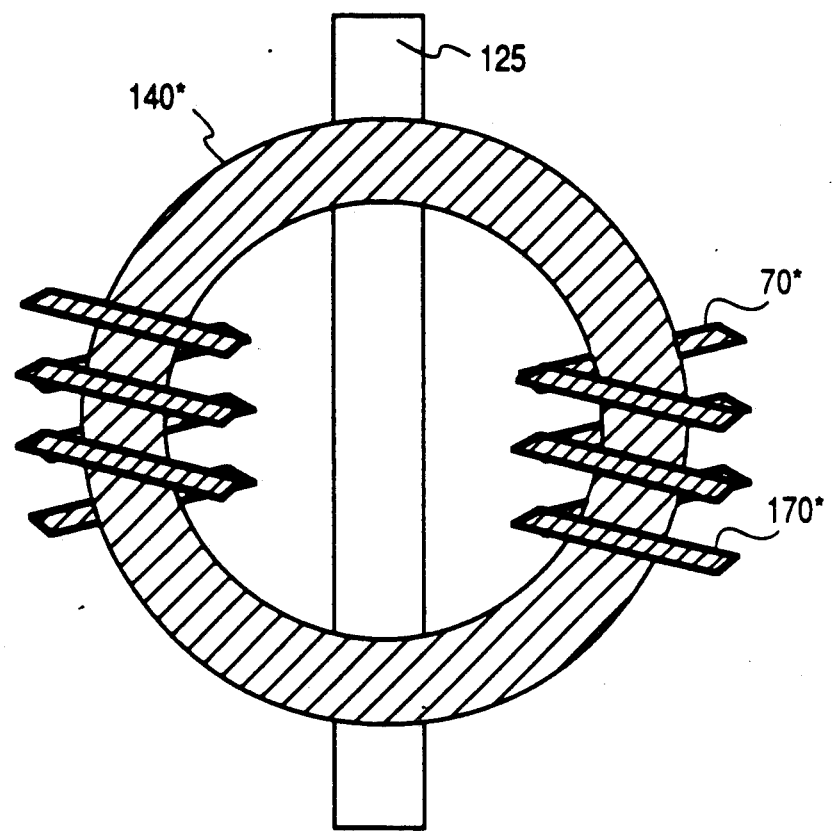
FIG. 4 is the top plan view of a toroidal transformer according to the invention.
Figure 5:
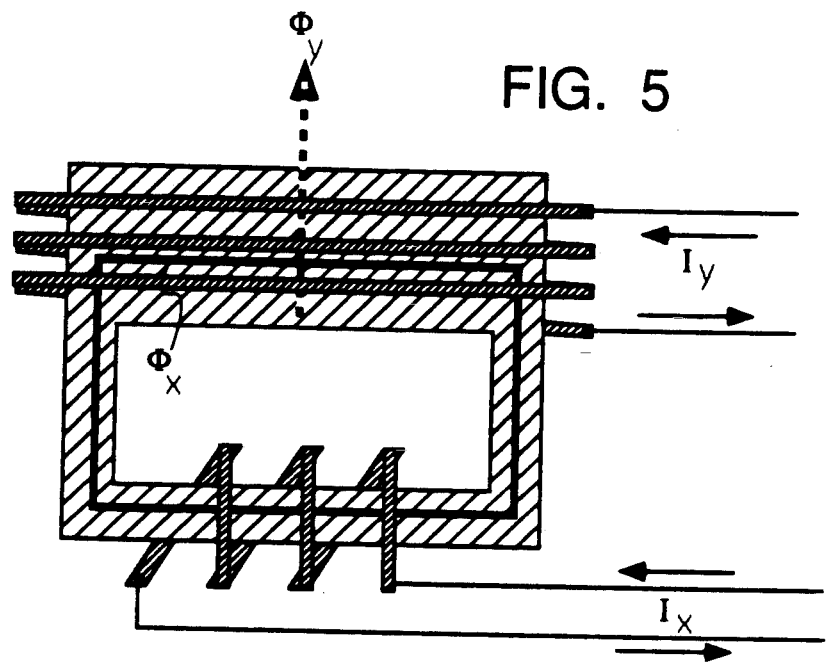
FIG. 5 is a top plan view of a multi-coil inductor having helical coils provided around transverse portions of a magnetic core layer so as to form a tunable inductor.

The above disclosed methods can be applied to produce a toroidal transformer such as shown in the top plan view of FIG. 4, a transverse multi-coil, tunable inductor structure such as shown in the top plan view of FIG. 5 and even electromagnetic relays such as shown in FIGS. 6-9.

Figure 23:
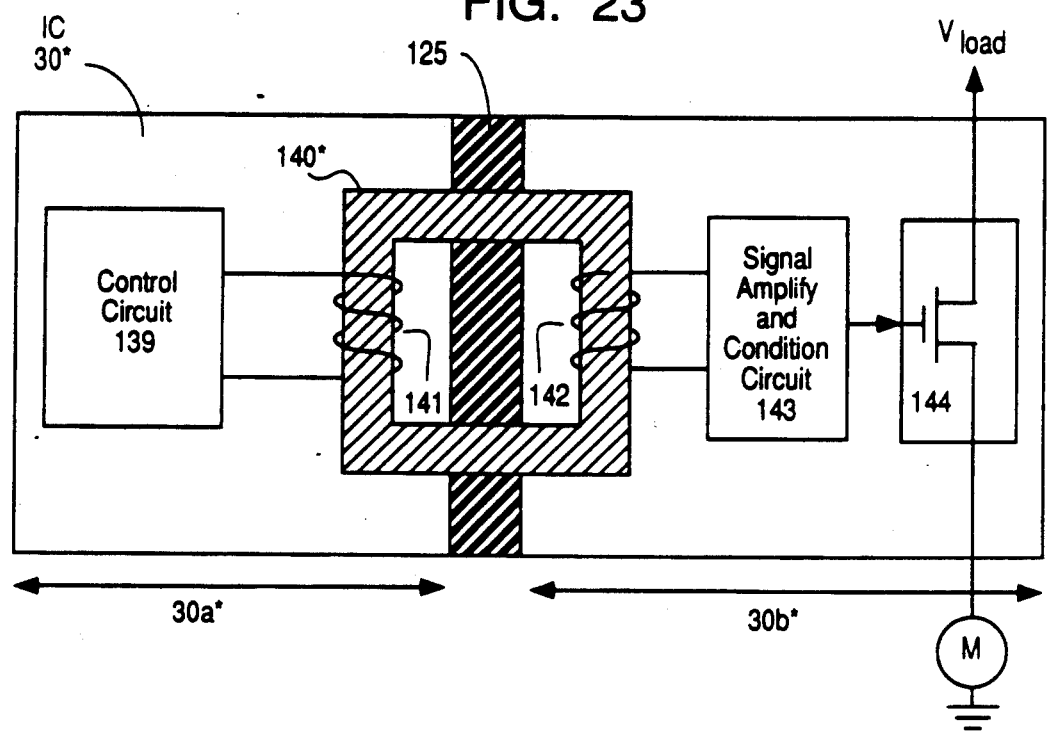
FIGS. 23 and 24 show top plan, schematic views of two solid-state-relay devices according to the invention.
Figure 24:
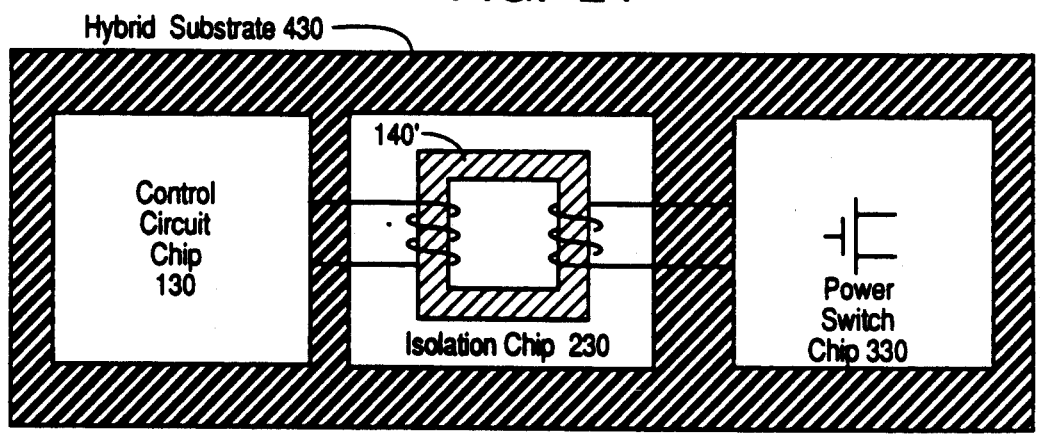

With respect to the transformer of FIG. 4, it should be apparent that so-called solid state relay circuits with transformer isolation can be easily fabricated with such a structure. An air gap or other suitable form of isolation can be provided through the underlying silicon substrate 30 and dielectrical material 125 can be extended up from the lower SiO$_2$ insulating layer 25 to isolate conductive sections of a single integrated circuit chip. More will be said about this when FIGS. 23 and 24 are later discussed.

Figure 6:
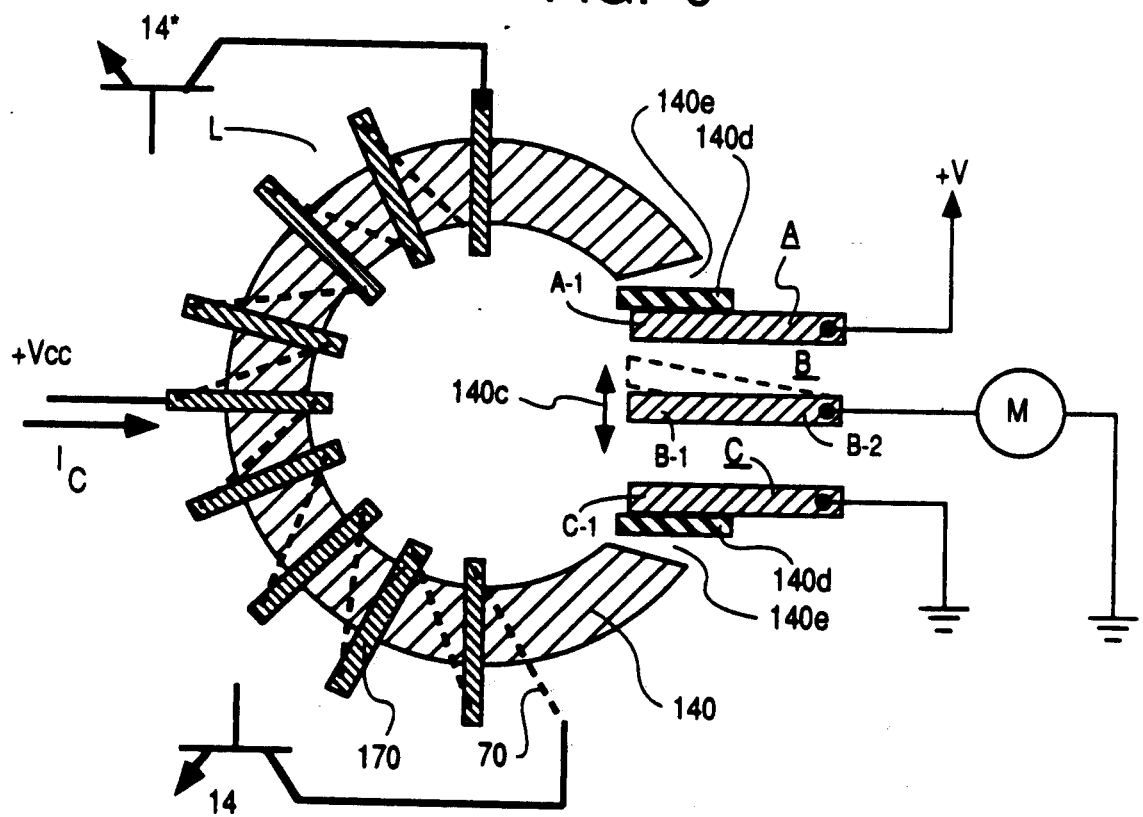
FIG. 6 is a top plan view of a relay structure positioned within a magnetic gap of a toroidal magnetic circuit.
Figure 7:
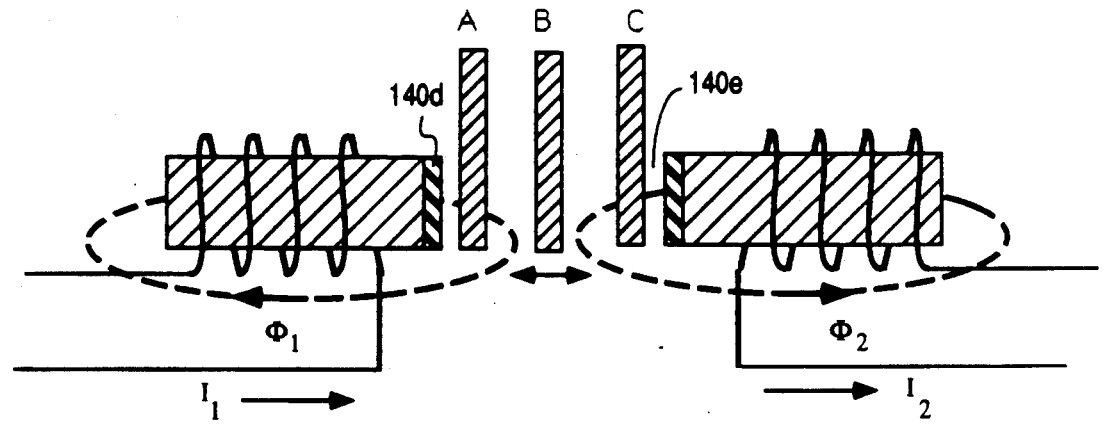
FIG. 7 is a top plan view of a relay armature disposed inside a rectangular multi-coil structure.

A method for forming electromechanical relays having the above described inductor as their energizing coil will now be described:

One embodiment of a relay in accordance with the invention can be easily understood by examining FIGS. 6 and 7. A magnetic gap 140c is introduced in the magnetic path of a toroidal (FIG. 6) or longitudinal (FIG. 7) inductor which is formed to have an electromagnetic core layer 140 extending parallel to the major surface of a semiconductor substrate as previously described. In the gap 140c, three metallic bars, A, B and C, are provided. These three bars A-C are electrically connected in their recited order, to an external power line V+, a relay load such as a motor M, and to a ground line. Suitable dielectric pads 140d and/or air gaps 140e are preferably provided between bars A, C and the material of the core layer 140 for electrically isolating the same from one another.

Preferably, the three bars A-C are made of a magnetic material having some resiliency and they are each covered with a good conductor material such as one selected from the group of conductors: gold, palladium, rhodium, and tungsten. The material of the bars can be chosen to be permanently magnetizable so as to create a biased relay or it can be chosen to be nonpermanently magnetizable so as to create a nonbiased relay. Selection of the covering conductor material may be based upon factors such as the wear resistance of the conductor material, on its oxidation resistance and on conductivity requirements of the overall circuit.

Bars A and C are preferably fixed relative to the substrate while middle bar B is formed to have a movable (nonstationary) first portion B-1 and an opposed second portion B-2 which is either fixedly or resiliently anchored to the substrate. The position of the movable first portion B-1 may be controlled by suitable switching of a control current $I_c$ flowing through the helical winding 70/170 of the miniature inductor L. The gaps between the bars A and B or B and C are preferably dimensioned very small, on the order of few microns, so that the middle bar B can be moved (as indicated by the double ended arrow) into contact with either of the side bars, A and B, with the provision of a very small amount of flux. The inductor L is preferably formed of a substantially toroidally shaped (annular) magnetic core, as described earlier, and as shown in FIG. 6, to maximize the level of magnetic flux in the magnetic circuit The construction of the inductor portion L of the relay has been covered in detail previously and therefore does not have to be repeated. The basic difference here is that a push-pull arrangement is shown for selecting the direction of current flow through the electromagnet. The construction of fixed bars A, C and the movable middle bar B in the magnetic gap 140c is as follows.

Figure 18A:
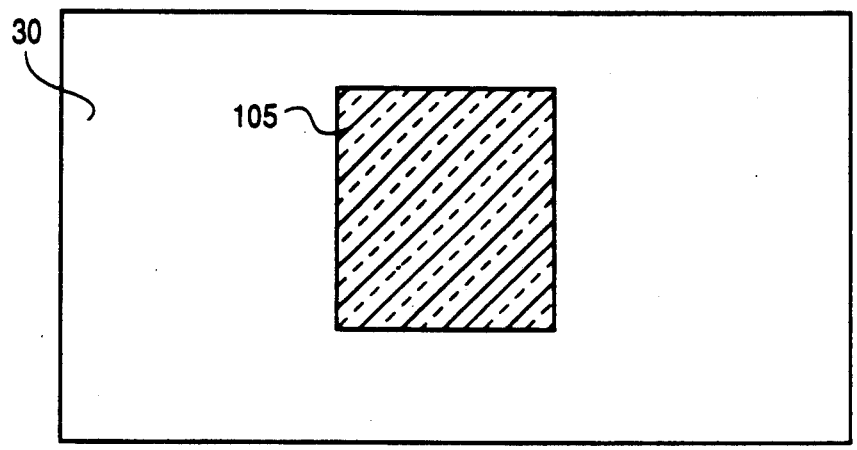
FIGS. 18A, 18B, 19A, 19B describe a method of making a relay.
Figure 18B:
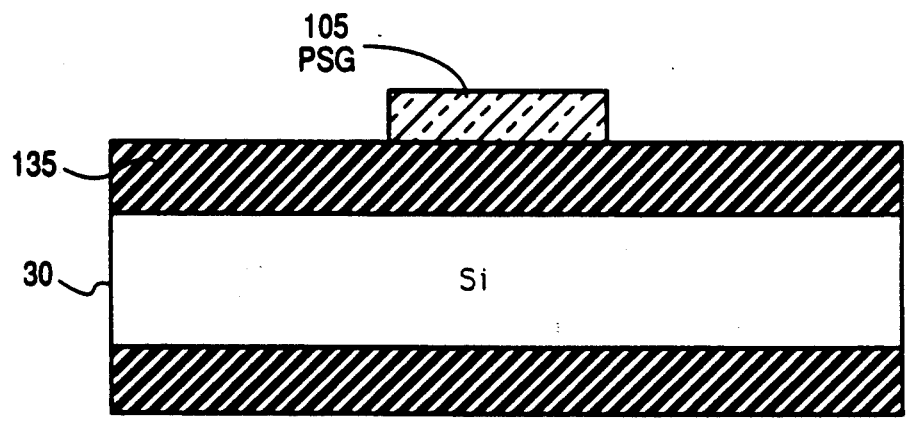

Referring to FIGS. 18A and 18B a doped phosphosilicate glass strip, PSG 105, (SiO$_2$ doped with 4% to 6% by weight phosphorus) is deposited on the SiO$_2$ insulating layer 135 of a semiconductor substrate 30 (preferably at the manufacturing step of FIG. 15B) and patterned as shown in FIGS. 18A, 18B to define a sacrificial support. The SiO$_2$ layer 135 is preferably 0.5-2 microns thick at the illustrated portion and the PSG strip 105 is preferably about 0.5-1 microns thick.

Figure 19A:
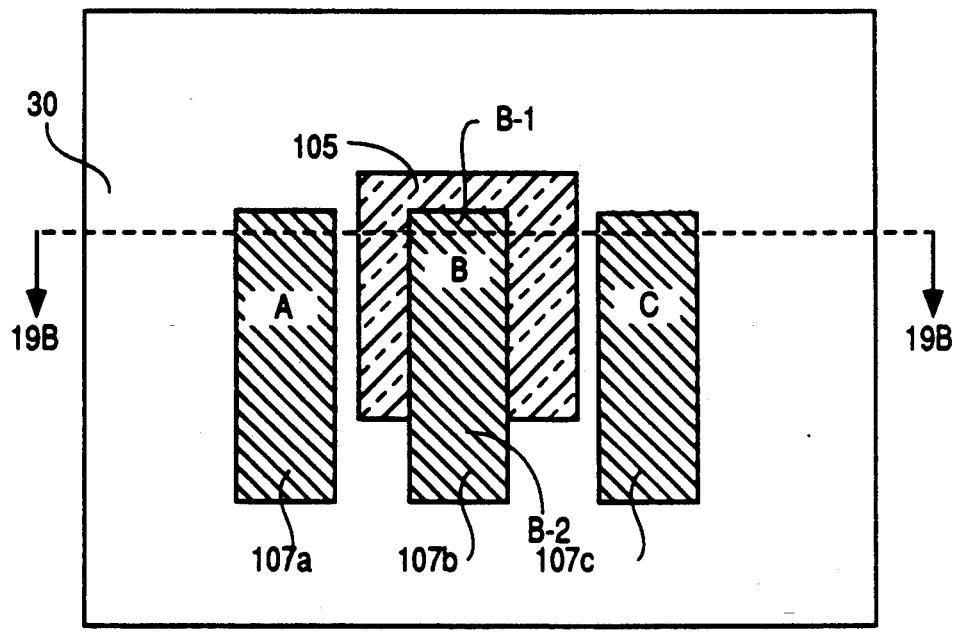
Figure 19B:
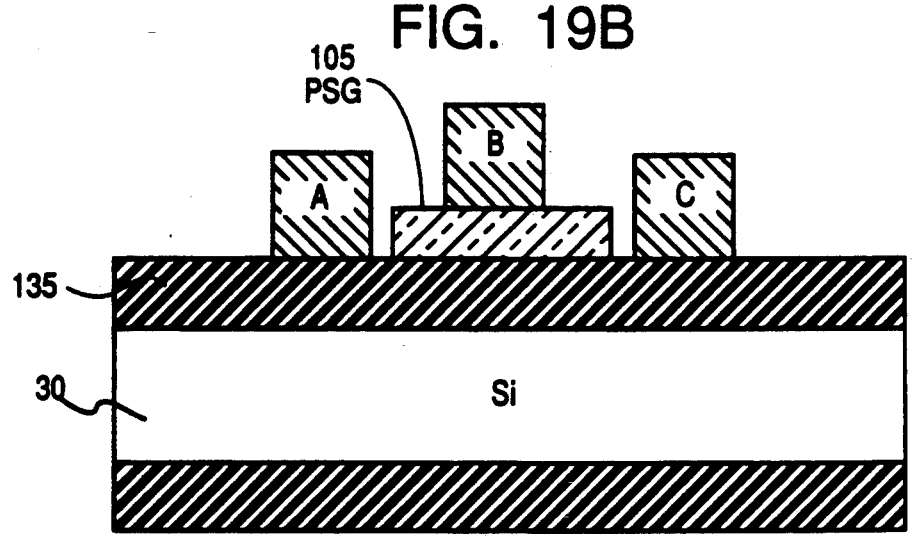

Referring to FIGS. 19A and 19B, three strips of magnetic material 107a, 107b and 107c, composed for example of cobalt or nickel, are deposited and patterned to form the earlier described fixed outer and movable middle bars A, C and B. These strips 107 are preferably coupled magnetically to the core layer 140 of FIG. 15B. Outer strips 107a and 107c are formed directly on the substrate dielectric 135 at positions spaced slightly apart (i.e., 3-10 microns) from opposed edges of the interposed PSG strip 105 while the middle magnetic strip 107b is deposited so as to be partially supported on the PSG strip 105. Typical thickness of the deposited magnetic film 107 can vary from 0.2-1.5 μm with varying width. The cross-sectional dimensions of magnetic strips 107a-107c depend on the current carrying capability required of the relay.

Referring to the top view of FIG. 19A, it is to be noted that the second portion B-2 of the middle bar B is extended beyond a corresponding end portion 105-2 of the PSG strip 105 and this second portion B-2 of the middle bar is anchored to the thermal SiO$_2$ layer 45. The material of the middle bar B should have some degree of resilience, or otherwise, a resilient intermediary material should be used to anchor the second portion B-2 to the substrate so that the opposed first portion B-1 will be able to move into and out of contact with outer bars A and C as will now be explained.

The first portion B-1 of the middle bar B is made free for movement by etching away the sacrificial PSG material of strip 105 with a suitable etchant such as buffered hydrofluoric acid without significantly etching the thermal SiO$_2$ layer 135. (By way of example, hydrofluoric acid can be diluted at a ratio of 20:1 by adding hot water, optionally buffering with NH$_4$OH, and applying the diluted mixture at 100°–120° C. to thereby preferentially etch away the PSG material.) If needed, the SiO$_2$ layer 135 can be easily protected by covering it with silicon nitride in a manner known to those skilled in the art.

Spacing between the three bars A–C is adjusted by known lithography and etching techniques. For example, 5 micron spacing can be easily achieved with presently known negative resist and chemical etching techniques. Once the PSG support 105 is removed, the first end B-1 of the middle bar is left suspended above the SiO$_2$ layer 135 in a manner which allows it to move laterally into contact with either of the outer bars A and C.

Upon application of control current I$_c$ in the inductor winding 70/170 in one direction, the produced magnetic flux can pull the free first end B-1 of the middle bar B towards a pole face A-1 of bar A and thereby connect the external load M to the power line V+. The relay or switch can be deenergized, by cutting off the control current I$_c$ or by reversing the control current so that the magnetic flux ceases or reverses. The resilient mechanical coupling of the middle bar B to the substrate 30 may be used to cause its free first portion B-1 to move away from bar A and towards bar C thereby opening the connection of the load M to the V+ line. If the magnetic circuit is suitably re-energized while the movable first portion B-1 of bar B is swinging to pole face C-1 of bar C, it is possible to close the B–C circuit. A desired preference in the closing direction of the middle bar B can be achieved by many known techniques including forming the B–C gap to be smaller than the B-A gap or by magnetically biasing the middle bar either permanently or temporarily with a coil wrapped about a stationary portion thereof (not shown).

Figure 8:
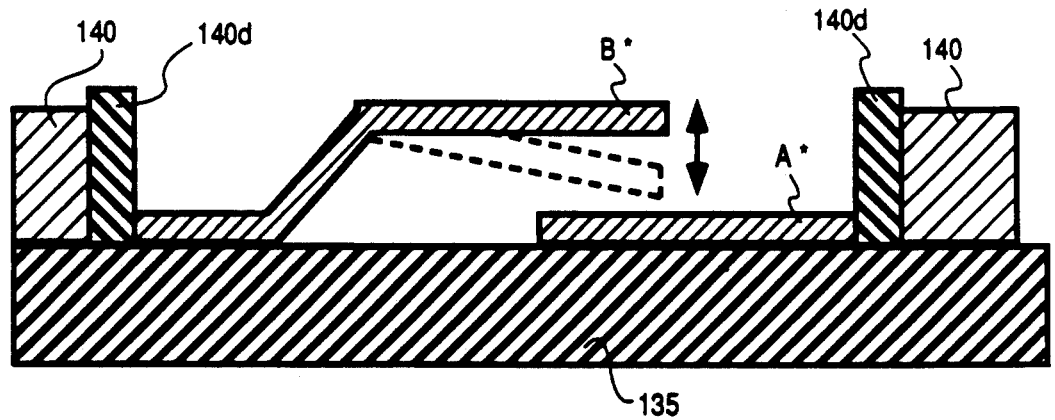
FIG. 8 is a side view of a relay having a movable armature which swings vertically relative to the substrate.
Figure 20:
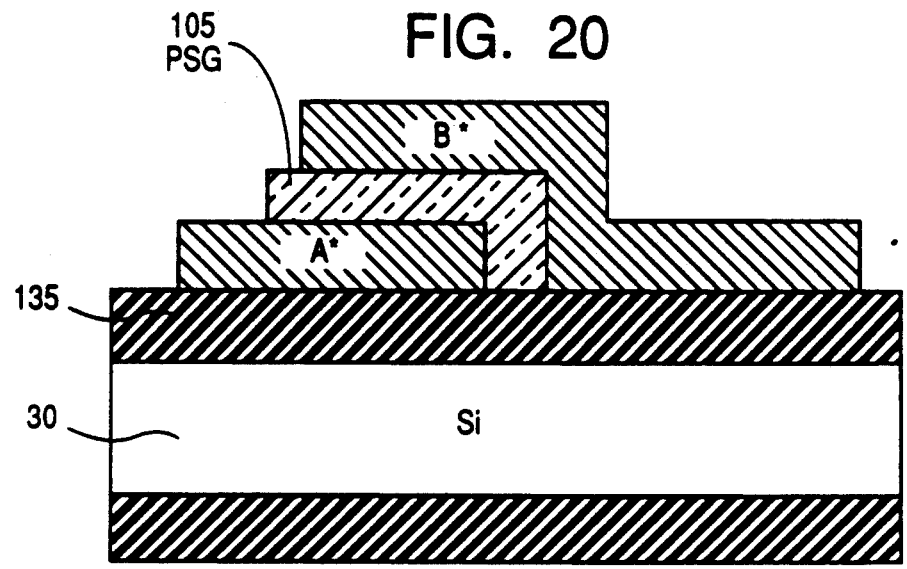
FIG. 20 describes an alternate method for making a relay.

Instead of arranging the bar B for lateral movement (parallel to the substrate surface), it is also possible to arrange the structure such that bar B swings up/down to make contact (FIG. 8). To achieve this a fixed bar A* (107) is deposited first and the sacrificial PSG strip (105) is overlayed on bar A* as indicated in FIG. 20. The movable bar B* is then deposited on top of the SiO$_2$ layer 45 and PSG strip 105 as shown. (The process of depositing PSG followed by formation of an overlying bar can be repeated to form a bar C* overhanging a portion of bar B and so forth as shown in FIG. 9. This will not be described for the sake of brevity.)

Upon etching away of the sacrificial PSG of FIG. 20, a movable portion B-1* of the second formed bar B* overhangs first formed bar A*. Contact in this case is made by vertical movement of the bar portion B-1*.

Figure 21:
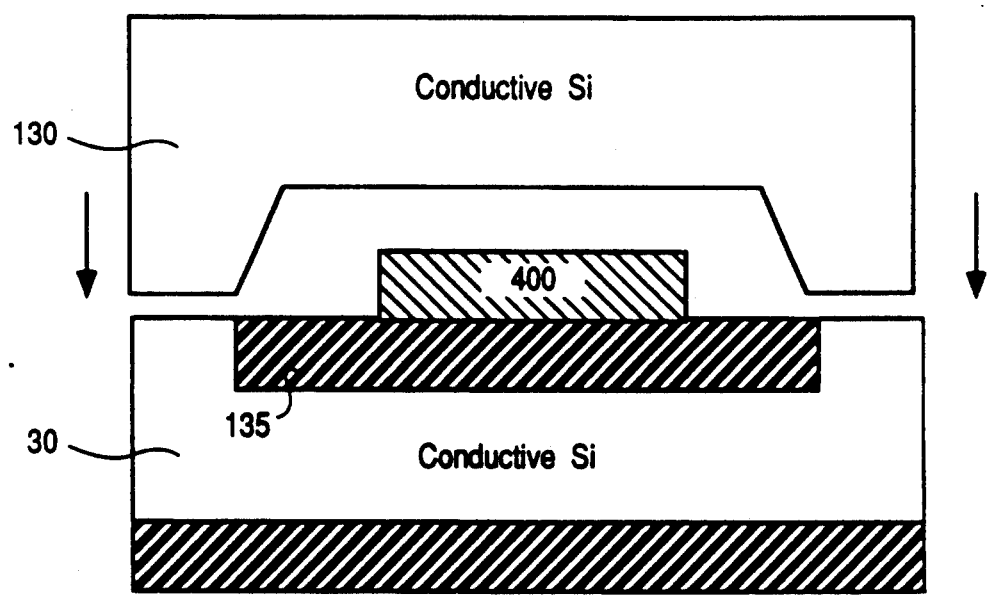
FIG. 21 shows a method for forming an electromagnetic interference shield.

The disclosed relay structures may be packaged to inhibit electromagnetic interference by completely enclosing the relay in a "metallic-box" like electrostatic shielding structure as indicated in the cross sectional view of FIG. 21. Since doped silicon can act as a good conductor, the structure can be enclosed by a silicon cavity whose side and top walls are formed in a second wafer. The second wafer can be inverted and joined by well known anodic bonding schemes to the wafer supporting the relay to thereby completely enclose the relay structure in a conductive shielding structure. Another way to shield the relay structure is to use standard metal cans of the type used for power transistors. The metal can may be used to seal the entire relay except for lead lines.

Figure 22A:
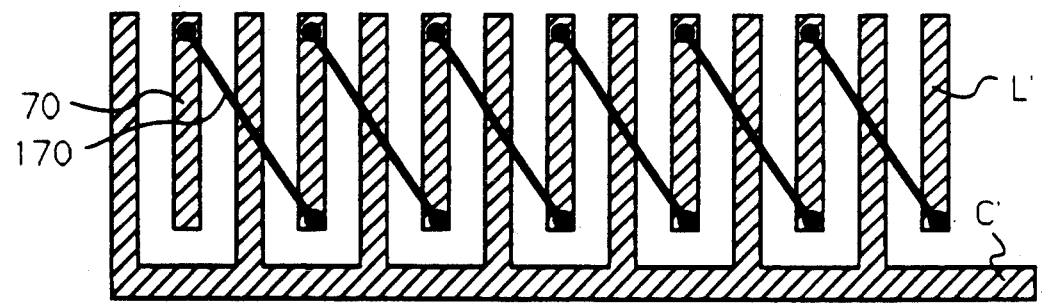
FIG. 22A shows a first method for forming an integral LC structure.

FIG. 22A is a top plan view showing one way of integrally forming a combined inductive-capacitive (LC) filter A comb-like conductor C' is interlaced between the conductor strips (70, 170) of the first and/or second conductor layers of the miniature inductor L'. Capacitive coupling takes place between the strips 70, 170 of the inductor L' and teeth of the comb-structure C'. If desired, the inductor L' can be formed in combination with a transverse second inductor so as to create a tunable inductor, such as the one shown in FIG. 5, to thereby form a tunable LC tank circuit.

Figure 22B:
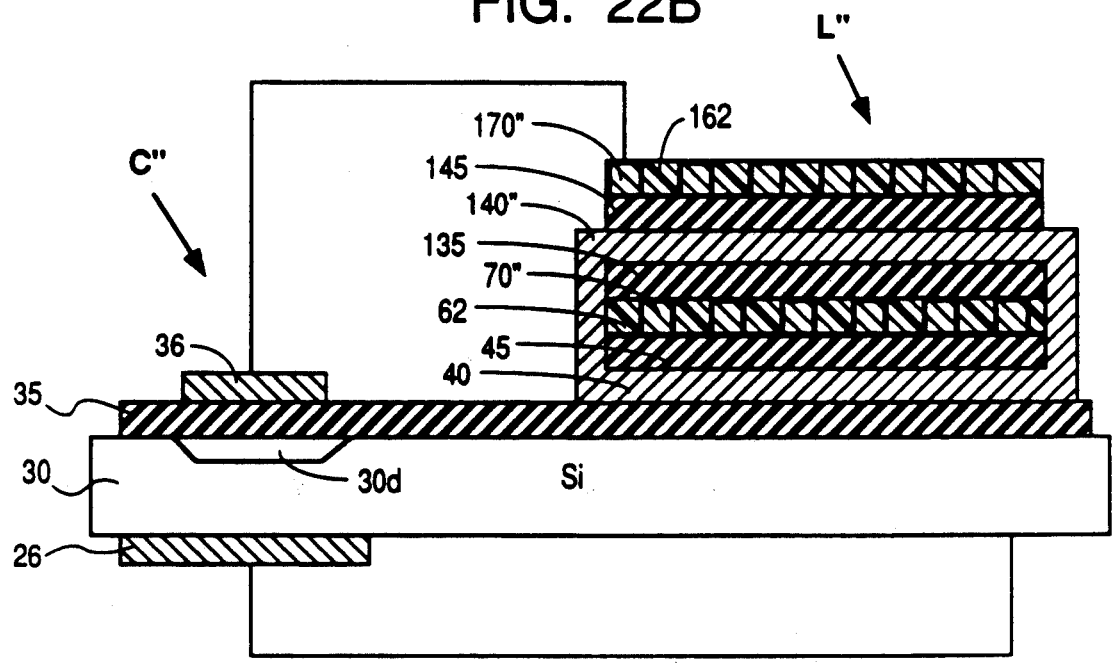
FIG. 22B an show a second method for forming an LC circuit.
Figure 22C:
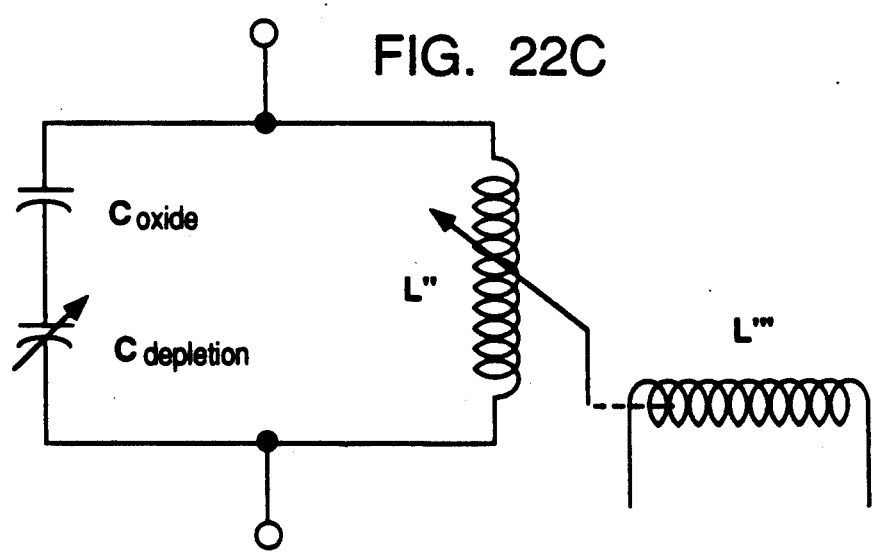

FIGS. 22B and 22C show another method for integrally combining an inductor L'' with a capacitor C''. The capacitor C'' is formed by standard semiconductor methods to comprise a semiconductive substrate 30, a bottom metal contact 26 connected to a bottom portion of the substrate 30, a silicon dioxide dielectric layer 35 formed over a top portion of the substrate 30, and an aluminum top contact 36. The semiconductor substrate 30 includes a lightly doped region 30d which may be depleted by application of a suitable bias voltage between the top contact 36 and the bottom contact 26. The overall capacitance of this capacitor C'' will vary depending on the level of depletion in the depletable region 30d. A schematic equivalent circuit of this capacitor C'' is illustrated in FIG. 22C.

Corresponding inductor L'' is formed adjacent to the capacitor C'' on the silicon dioxide insulation layer 35 as described before. Aluminum conductor strips 70'', 170'' are preferably used in place of the thick copper strips for this inductor L''. An interfacial layer of TiW or Cr may be used between the aluminum layers 36, 70'', and 170'' and their corresponding dielectric support layers 35, 45 and 145 as before.

Referring to FIG. 22C, it can be seen that a tunable LC circuit may be formed of the capacitor C'' and inductor L'' whose cross-sections are shown in FIG. 22B. The inductor L'' may be optionally formed as a tunable inductor by providing a secondary magnetic path L''' which is transverse to the conductive path of the inductor L'' to thereby also tune the inductor L'' if desired.

FIGS. 23 and 24 show two methods for implementing transformer isolated control circuits in accordance with the invention. Referring to FIG. 23, a monolithic integrated circuit chip 30* is subdivided into a low power control portion 30a* and a high power switching portion 30b* by selectively oxidizing a portion thereof to create a dielectric isolating section 125. An annular core portion 140* is formed across the isolating section 125 as shown and suitable coils, 141 and 142, are provided respectively at the lower power section and high power section of the core 140* as previously discussed. Signals from the high power side coil 142 are coupled to a signal amplification and conditioning circuit 143 for filtering out undesired noise and for increasing the power level of the signals present on the high power side coil 142. As mentioned previously, if the current levels in the high power slide coil 142 are relatively small, the coil 142 may be formed of a less conductive metal such as aluminum rather than a more conductive metal such as copper (or gold or silver). The output signals of the amplifying and conditioning circuit 143 are applied to a power switching means 144 which by way of example could be formed of a high power MOSFET or a bipolar transistor or a combination thereof. The high power switching means 144 opens and closes a load circuit (motor M and load supply V$_{load}$) in response to the output signals of the amplifying and conditioning circuit 143. Control circuit 139 is provided with the necessary logic for actuating the power switching means 144 as desired.

Referring to FIG. 24, there is shown another way for implementing circuit isolation. Separate control, isolation, and power monolithic chips, 130, 230 and 330, are spaced apart and bonded to a nonconductive hybrid substrate 430. One or more isolation transformers 140' are provided on the isolation chip 230 as earlier discussed. The coils of the isolation chip 230 are suitably connected to control circuits on the control circuit chip 130 and to power switching circuits on the power switching chip 330 using known hybrid circuit interconnection techniques to isolate the circuitry of the control circuit chip 130 from the circuitry of the power switch chip 330.

While the above described embodiments of the invention are the preferred ones, it should be understood that they are not the only ones possible with the invention. The variations are endless. Those skilled in the art will be able to realize many modifications to the disclosed embodiments once the principles and the spirit of the invention are appreciated. As such, the scope of the claimed invention should be defined by the following claims and by equivalent embodiments thereof rather than by mere reference to the preferred embodiments described herein.

I claim:

1. An electromagnetic device comprising:
   a semiconductor substrate having one or more electrical circuits integrally defined therein;
   a magnetic shield layer disposed over the substrate,
   a first layer of spaced apart conductive strips disposed over the shield layer;
   a magnetic core layer superimposed on the first layer of conductive strips patterned to define first and second transverse magnetic paths;
   a second layer of spaced apart conductive strips superimposed on the magnetic core layer; portions of the conductive strips of the second layer are connected to portions of the conductive strips of the first layer to form first and second, substantially helical electrical paths each spiralling about at least one portion of the magnetic core layer for generating or detecting magnetic flux in said one portion of the magnetic core layer, said portion of the magnetic core layer including at least one of said first and second transverse magnetic paths, wherein said magnetic shield layer shields one or more of said electrical circuits from the flux generated or detected by the first and second helical electrical paths.

2. An electromagnetic device comprising:
   a semiconductor substrate having one or more electrical circuits integrally defined therein;
   a magnetic shield layer disposed over the substrate,
   a first layer of spaced apart conductive strips disposed over the shield layer;
   a magnetic core layer superimposed of the first layer of conductive strips;
   a second layer of spaced apart conductive strips superimposed on the magnetic core layer, portions of the conductive strips of the second layer connected to portions of the conductive strips of the first layer to form a first substantially helical electrical path which spirals about at least one portion of the magnetic core layer for generating or detecting magnetic flux in said one portion of the core layer, and wherein said magnetic shield layer shields one or more of said electrical circuits from the flux generated or detected by the first helical electrical path; and a movable member which is moved by a force induced by the magnetic flux of the magnetic core layer.

3. The electromagnet of claim 2 wherein the movable bar is resiliently anchored to the substrate.

4. An electromagnetic device comprising:
   a semiconductor substrate having one or more electrical circuits integrally defined therein;
   a magnetic shield layer disposed over the substrate,
   a first layer of spaced apart conductive strips disposed over the shield layer;
   a magnetic core layer superimposed on the first layer of conductive strips;
   a second layer of spaced apart conductive strips superimposed on the magnetic core layer, portions of the conductive strips of the second layer connected to portions of the conductive strips of the first layer to form a first, substantially helical electrical path which spirals about at least one portion of the magnetic core layer for generating or detecting magnetic flux in said one portion of the core layer, wherein said magnetic shield layer shields one or more of said electrical circuits from the flux generated or detected by the first helical electrical path and wherein the one or more electrical circuits of the semiconductor substrate include a plurality of transistors, the helical electrical path has three connection terminals, and at least two of the transistors are electrically coupled to a corresponding two of the connection terminals.

5. An electromagnetic device comprising:
   a semiconductor substrate having one or more electrical circuits integrally defined therein;
   a magnetic shield layer disposed over the substrate,
   a first layer of spaced apart conductive strips disposed over the shield layer;
   a magnetic core layer superimposed on the first layer of conductive strips;
   a second layer of spaced apart conductive strips superimposed on the magnetic core layer, portions of the conductive strips of the second layer connected to portions of the conductive strips of the first layer to form a first, substantially helical electrical path which spirals about at least one portion of the magnetic core layer for generating or detecting magnetic flux in said one portion of the core layer, wherein said magnetic shield layer shields one or more of said electrical circuits from the flux generated or detected by the first helical electrical path,
   wherein the magnetic core layer includes a substantially annular section having two or more helical electrical paths spiraling there about, said two or more helical electrical paths being electrically isolated from one another, and wherein:
   the number of electrical circuit integrally defined in the semiconductor substrate is more than one;
   the semiconductor substrate includes substrate isolation means for subdividing the plural electrical circuits of the semiconductor substrate into at least first and second electrically isolated circuit portions and
   the substantially annular section of the magnetic core layer is positioned to define a magnetic coupling path extending across the substrate isolation means to magnetically couple the first circuit portion to the second circuit portion.

6. A method for forming an integrated electromagnetic device comprising:

forming a layer of polyimide on or above the semiconductor substrate;

patterning the polyimide layer to define vias extending though the polyimide layer;

depositing a metal film on the patterned polyimide layer such that a portion of the deposited metal film adheres to the bottoms of the vias; and removing portions of the metal film which have not adhered to the bottoms of the vias;

providing a semiconductor substrate having an integrated circuit integrally defined therein;

providing a bonding layer;

forming a first winding layer on the bonding layer of spaced apart, electrically conductive strips on the substrate, the first winding layer being composed of a first electrically conductive material;

forming a magnetic core above the first layer of conductive strips, the magnetic core being shaped so as to permit the formation of a helical electrical path thereabout where the helical electrical path is to include the conductive strips of the first layer;

forming a second winding layer of spaced apart, electrically conductive strips above the magnetic core, the second winding layer being composed of a second electrically conductive material; and connecting the conductive strips of the first and second winding layers so as to define a substantially helical electrical path spiraling about the magnetic core;

wherein the forming of the first and second winding layers includes electroplating at least some of at least one of the first and second electrically conductive materials which form the respective conductive strips of the first and second winding layers.

* * * * *